US011309333B2

(12) United States Patent
Maeno

(10) Patent No.: US 11,309,333 B2
(45) Date of Patent: Apr. 19, 2022

(54) SEMICONDUCTOR INTEGRATED CIRCUIT

(71) Applicant: KIOXIA CORPORATION, Tokyo (JP)

(72) Inventor: Muneaki Maeno, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/997,878

(22) Filed: Aug. 19, 2020

(65) Prior Publication Data

US 2021/0193682 A1    Jun. 24, 2021

(30) Foreign Application Priority Data

Dec. 24, 2019   (JP) .............................. JP2019-232613

(51) Int. Cl.
*H01L 27/118*    (2006.01)
*H01L 27/02*     (2006.01)

(52) U.S. Cl.
CPC .... *H01L 27/11807* (2013.01); *H01L 27/0274* (2013.01); *H01L 2027/11824* (2013.01); *H01L 2027/11866* (2013.01); *H01L 2027/11881* (2013.01)

(58) Field of Classification Search
CPC combination set(s) only.
See application file for complete search history.

(56) References Cited

U.S. PATENT DOCUMENTS

| | | | |
|---|---|---|---|
| 5,751,651 | A | 5/1998 | Ooishi |
| 6,396,306 | B2 | 5/2002 | Dring et al. |
| 7,221,183 | B2 | 5/2007 | Chen |
| 7,663,851 | B2 | 2/2010 | Huang et al. |
| 9,601,921 | B2 | 3/2017 | Guo et al. |
| 10,430,541 | B2 | 10/2019 | Ke et al. |
| 10,833,678 | B1 * | 11/2020 | Armstrong ......... H03K 19/0948 |
| 2002/0000873 | A1 | 1/2002 | Tanizaki et al. |
| 2009/0249273 | A1 | 10/2009 | Tsai et al. |
| 2011/0260784 | A1 | 10/2011 | Eimitsu et al. |

(Continued)

FOREIGN PATENT DOCUMENTS

| | | |
|---|---|---|
| JP | H08-138381 A | 5/1996 |
| JP | H09-36245 A | 2/1997 |

(Continued)

*Primary Examiner* — Sheng-Bai Zhu
(74) *Attorney, Agent, or Firm* — Kim & Stewart LLP

(57) ABSTRACT

A semiconductor integrated circuit includes a first power line to which a first voltage is continuously applied, a second power line, a power switch cell connected to the first power line and configured to output a second voltage to the second power line according to a first signal, a logic circuit driven by the second voltage applied via the second power line, a first circuit driven by the second voltage applied via the second power line and configured to output a third voltage to logic circuit according to a second signal which is an inverted signal of the first signal, and a second circuit driven by the second voltage applied via the second power line and configured to output a fourth voltage to logic circuit according to a third signal which is an inverted signal of the second signal, the fourth voltage being lower than the third voltage.

19 Claims, 22 Drawing Sheets

(56) References Cited

U.S. PATENT DOCUMENTS

| | | | |
|---|---|---|---|
| 2012/0074926 A1* | 3/2012 | Sugiyama | H01L 27/0274 324/76.11 |
| 2015/0188313 A1* | 7/2015 | Guo | H01L 27/0266 361/56 |
| 2017/0229457 A1 | 8/2017 | Maeno | |
| 2019/0181135 A1 | 6/2019 | Huang et al. | |

FOREIGN PATENT DOCUMENTS

| | | |
|---|---|---|
| JP | H10-223773 A | 8/1998 |
| JP | 2000-195254 A | 7/2000 |
| JP | 2003-086699 A | 3/2003 |
| JP | 2004-503948 A | 2/2004 |
| JP | 2011-233945 A | 11/2011 |
| JP | 2012-222065 A | 11/2012 |
| JP | 2018-142745 A | 9/2018 |
| JP | 6407900 B2 | 10/2018 |
| JP | 6510120 B2 | 5/2019 |
| WO | 01/97380 A1 | 12/2001 |

* cited by examiner

SEMICONDUCTOR INTEGRATED CIRCUIT

CROSS-REFERENCE TO RELATED APPLICATION(S)

This application is based upon and claims the benefit of priority from Japanese Patent Application No. 2019-232613, filed Dec. 24, 2019, the entire contents of which are incorporated herein by reference.

FIELD

Embodiments described herein relate generally to a semiconductor integrated circuit.

BACKGROUND

For the purpose of reducing power consumption, a semiconductor integrated circuit for a memory has an energization region to which power is always supplied and a power shutdown region to which power is usually not supplied and is supplied when necessary. In such an integrated circuit, power switch cells (PSWs) may be disposed at the boundary between the energization region and the power shutdown region to control the power supply from the energization region to the power shutdown region.

A semiconductor integrated circuit including TIE cells is also known as a countermeasure against an electrostatic discharge (ESD).

DETAILED DESCRIPTION

Figure 1A:
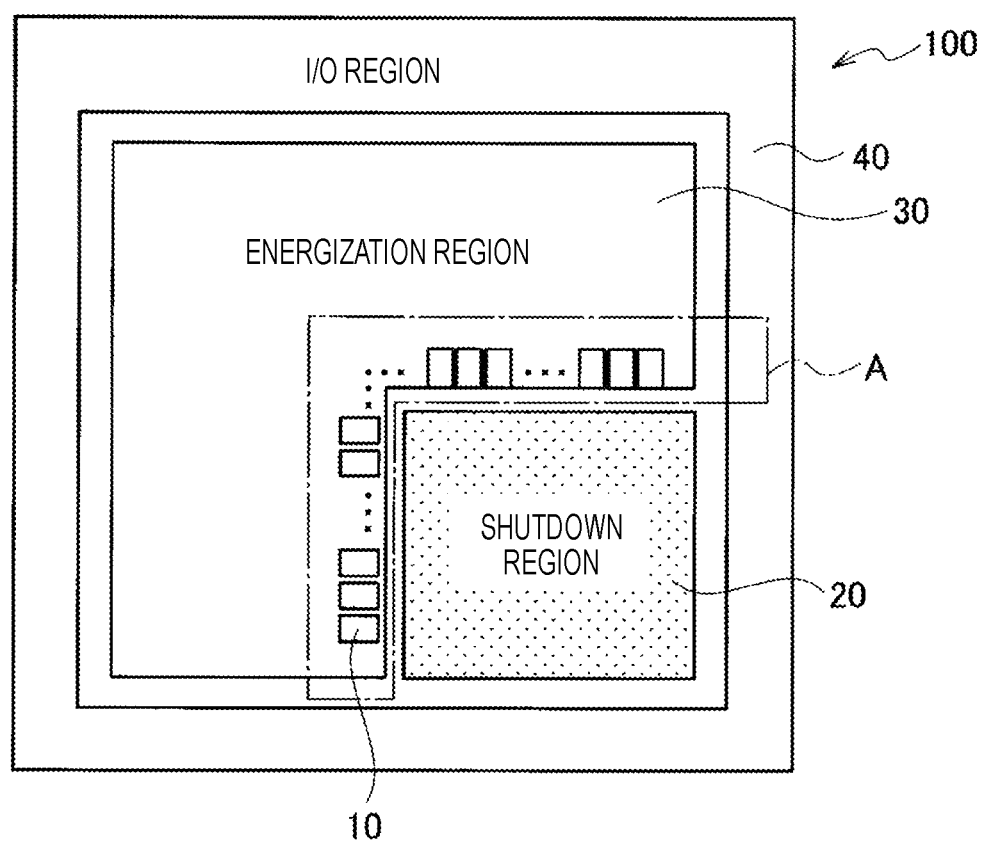
FIG. 1A is a schematic diagram of a semiconductor integrated circuit where power switch cells are disposed outside a shutdown region.

Certain embodiments provide a semiconductor integrated circuit which has a relatively high resistance to the ESD and achieves a fast response speed.

In general, according to one embodiment, a semiconductor integrated circuit includes a first power line to which a first voltage is continuously applied, a second power line, a first power switch cell connected to the first power line and configured to output a second voltage to the second power line according to a first signal, a first logic circuit driven by the second voltage applied via the second power line, a first circuit driven by the second voltage applied via the second power line and configured to output a third voltage to first logic circuit according to a second signal which is an inverted signal of the first signal, and a second circuit driven by the second voltage applied via the second power line and configured to output a fourth voltage to first logic circuit according to a third signal which is an inverted signal of the second signal, the fourth voltage being lower than the third voltage.

Next, example embodiments will be described with reference to the accompanying drawings. In the descriptions of the drawings herein below, the same or substantially similar portions will be denoted by the same reference numerals. However, in general, the drawings are schematic, and any depicted relationship between a thickness and a plane dimension of components or the like may be different from one utilized in an actual implementation. The specific thickness or dimension of a component and/or layer for an actual implementation of the present disclosure can be determined in consideration of the descriptions herein. Furthermore, depicted ratios and relative sizes of aspects and/or components may be different drawing to drawing for reasons related to descriptive purpose and/or explanatory convenience.

Furthermore, each embodiment described hereinafter is an example of an apparatus or a method for embodying the technical concepts of the present disclosure, and, therefore, may not necessarily specify or limit a material, a shape, a structure, an arrangement or the like of each component. That is, the example embodiments may be modified in various ways and still be within the scope of the subject matter disclosed and claimed herein.

In the following descriptions, a first power line will be referred to as a VDDC line or more simply just VDDC, and a second power line will be referred to as a VDDI line or more simply just VDDI. However, in some instances, the voltage of the first power line may also be referred to as VDDC, and, likewise, a voltage of the second power line may also be referred to as VDDI. As for a TIE cell, a TIE-high cell may be referred to as TIEH, and a TIE-low cell may be referred to as TIEL. Furthermore, in some instances, a low level output signal of the TIE-low cell may also be referred to as TIEL, and, likewise, a high level output signal of the TIE-high cell may also be referred to as TIEH.

First Embodiment (Semiconductor Integrated Circuit SoC)

FIG. 1A is a schematic diagram of a semiconductor integrated circuit 100 according to a first embodiment where a plurality of power switch cells (PSWs) 10 are disposed outside a shutdown region 20.

The semiconductor integrated circuit 100 is an example of a SoC (system on chip) integrated circuit. The semiconductor integrated circuit 100 includes an energization region 30 as a first region and the shutdown region 20 as a second region. A power is always supplied to the energization region 30 as long as the semiconductor integrated circuit 100 is powered on. The shutdown region 20 is not energized at all times, and a power is supplied to the shutdown region 20 as needed. The plurality of PSWs 10 is disposed in a boundary region between the energization region 30 and the shutdown region 20. An input/output (I/O) region 40 is disposed around the energization region 30 and the shutdown region 20.

Figure 3:
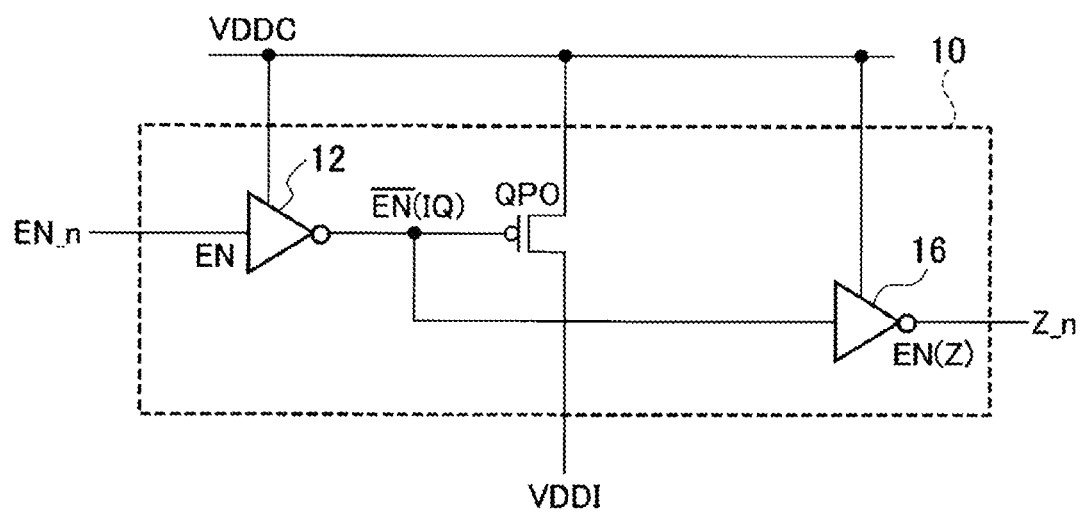
FIG. 3 is a circuit diagram of a power switch cell which may be mounted in a semiconductor integrated circuit.

Each PSW 10 operates as a power switch cell, and has the circuit configuration illustrated in FIG. 3.

Figure 1B:
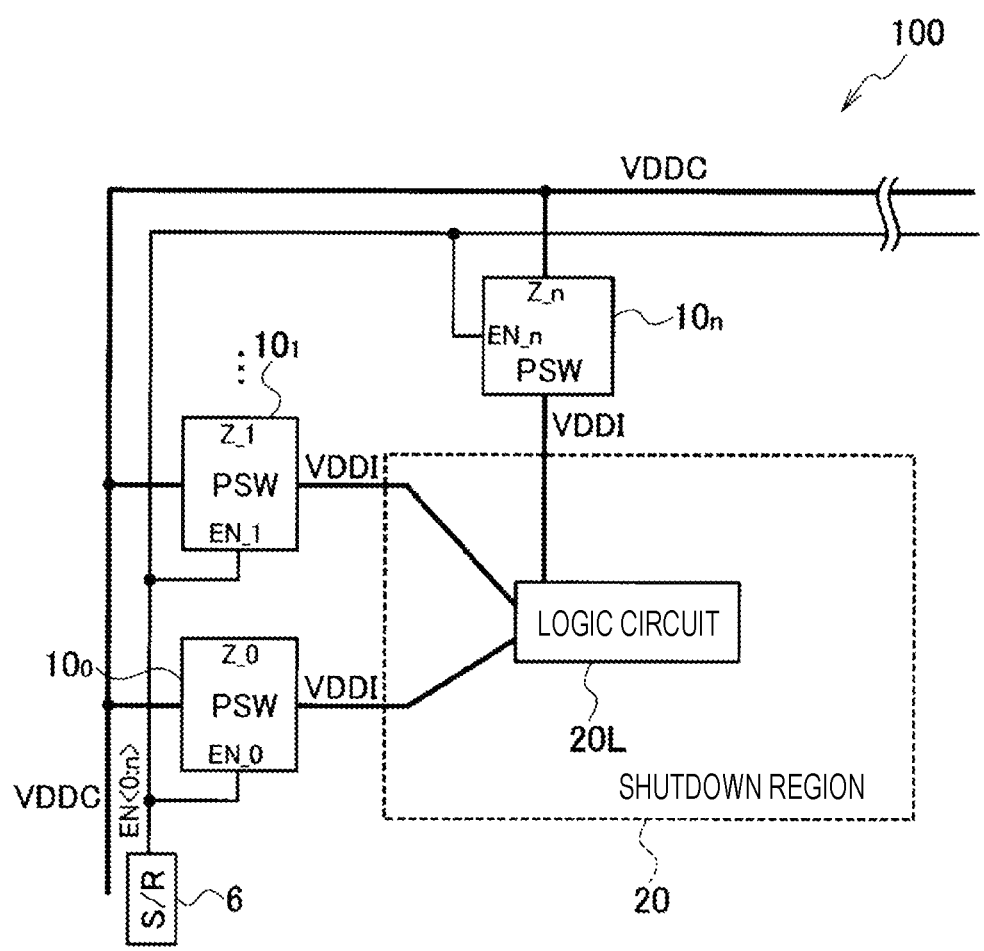
FIG. 1B is a circuit diagram of a region A and the shutdown region in FIG. 1A.

FIG. 1B is a circuit diagram of the region A and the shutdown region 20 shown in FIG. 1A.

As illustrated in FIG. 1B, a plurality of PSWs 10 (PSW $10_0, 10_1, \ldots,$ and $10_n$) is disposed between a first power line VDDC that supplies a power to the energization region 30 and a second power line VDDI that supplies a power to the shutdown region 20. The second power line VDDI is connected to, for example, a logic circuit 20L inside the shutdown region 20, and supplies the power voltage VDDI from the first power line VDDC to the logic circuit 20L or cuts off the power voltage VDDI, by a switching operation of the plurality of PSWs 10. The voltage of the second power line VDDI varies between 0 to VDDC according to the switching operation of individual PSWs 10 (PSW $10_0, 10_1, \ldots,$ and $10_n$).

Figure 2A:
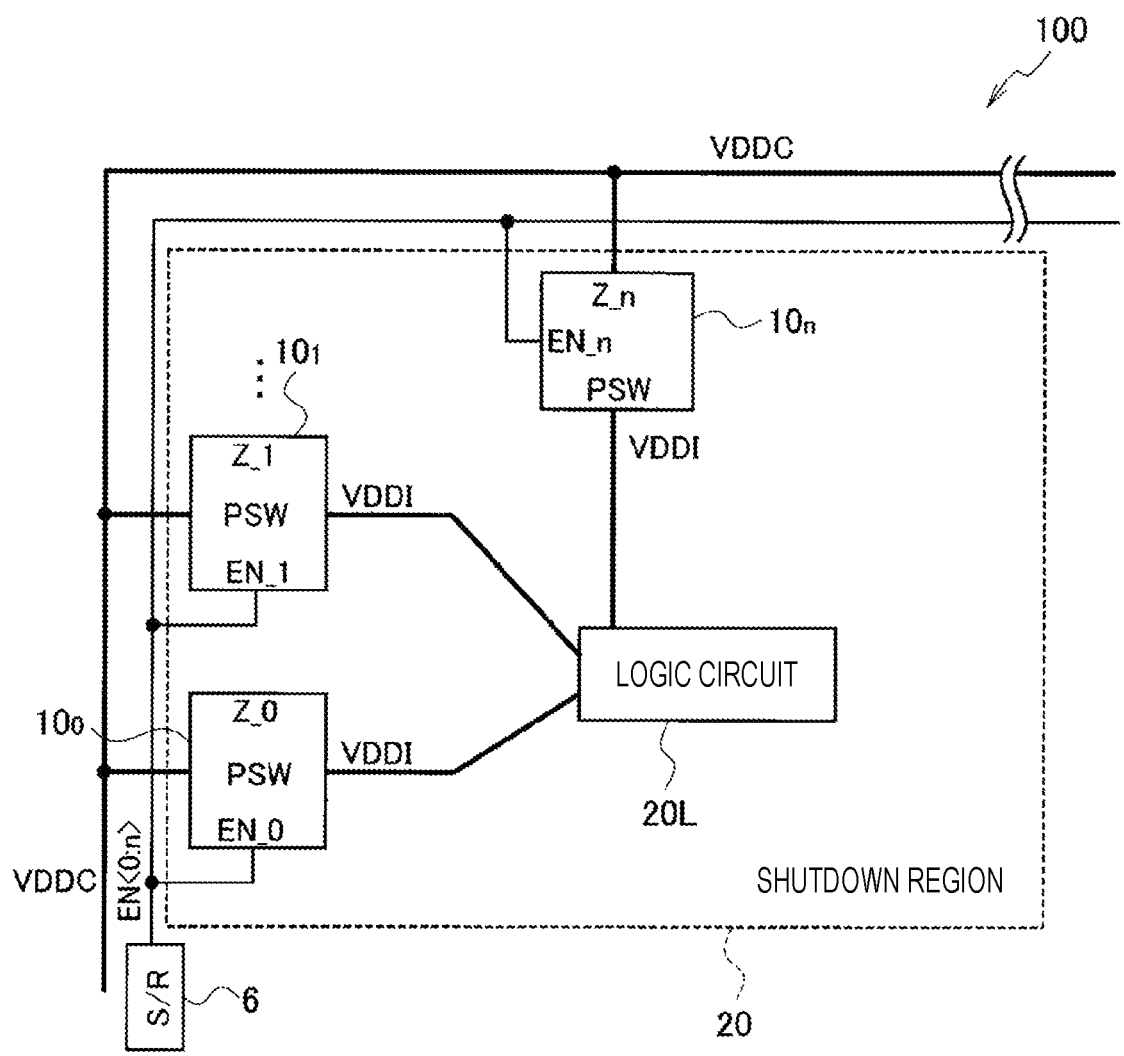
FIG. 2A is a circuit diagram of a semiconductor integrated circuit where power switch cells are disposed inside a shutdown region.

FIG. 2A is a circuit diagram of the semiconductor integrated circuit 100 where a plurality of PSWs are disposed inside the shutdown region 20. As illustrated in FIG. 2A, the plurality of PSWs 10 are disposed inside the shutdown region 20. The PSWs 10 are each connected to the first power line VDDC.

Figure 2B:
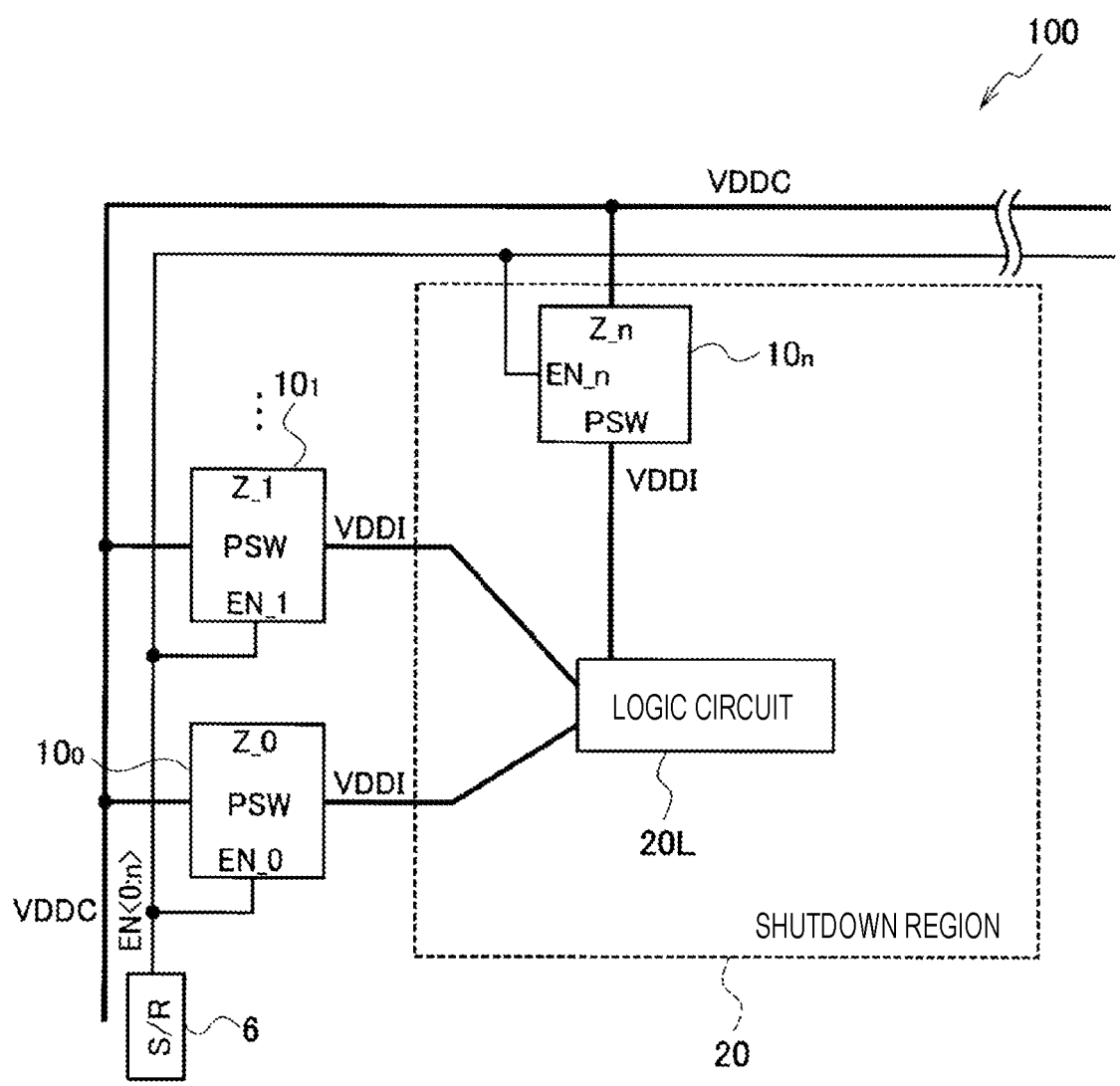
FIG. 2B is a circuit diagram of a semiconductor integrated circuit where power switch cells are disposed inside and outside a shutdown region.

FIG. 2B is a circuit diagram of the semiconductor integrated circuit 100 where a plurality of PSW are disposed inside and outside the shutdown region 20. As illustrated in FIG. 2B, among the plurality of PSWs 10, a PSW 10, is disposed inside the shutdown region 20, and the other PSWs are disposed outside the shutdown region 20. Each of PSW $10_0, 10_1, \ldots,$ and $10_n$ is connected to the first power line VDDC.

FIG. 3A is a circuit diagram of a PSW 10 mounted in the semiconductor integrated circuit 100.

Figure 4:
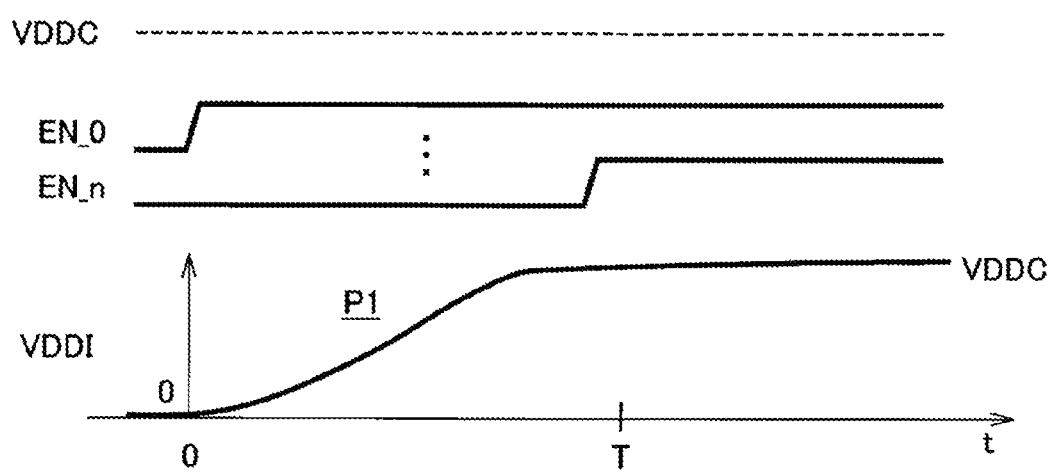
FIG. 4 is a diagram illustrating waveforms of a voltage applied to a shutdown region via a plurality of power switch cells and switch signals.

FIG. 4 is a diagram illustrating waveforms of a voltage VDDI applied to the shutdown region 20 via the plurality of PSWs and switch signals EN_0-EN_n.

As illustrated in FIG. 1B, an input signal EN is input to PSWs 10 by an operation of a shift register (S/R) 6. Here, the signals input to PSWs $10_0, 10_1, \ldots,$ and $10_n$ will be referred to as input signals EN_0, EN_1, ..., and EN_n, respectively.

First, the input signals EN_0, EN_1, ..., and EN_n are sequentially input to PSWs $10_0, 10_1, \ldots,$ and $10_n$ by the operation of the shift resister (S/R) 6.

Each PSW 10 outputs a signal Z. Here, the signals output from PSWs $10_0, 10_1, \ldots,$ and $10_n$ will be referred to as output signals Z_0, Z_1, ..., and Z_n, respectively.

As illustrated in FIG. 3, a PSW 10 in the semiconductor integrated circuit 100 includes a first inverter gate 12 that is connected to the first power line VDDC and outputs $\overline{EN}$(IQ) which is an inverted signal of the input signal EN, a second inverter gate 16 that is connected to the first power line VDDC and outputs a signal EN(Z) which is an inverted signal of $\overline{EN}$(IQ), and a switch QPO that is disposed between the first power line VDDC and the second power line VDDI, and supplies a second power from the first power line VDDC to the second power line VDDI in response to $\overline{EN}$(IQ). Here, the switch QPO includes a P channel metal-oxide semiconductor field effect transistor (PMOSFET).

In addition, a current supply capacity is determined by a size of a transistor or a threshold voltage. Specifically, the current supply capability may be changed by changing a ratio of a channel width W to a channel length L of the transistor. Further, the current supply capacity may be changed even by changing a threshold voltage. In order to change the threshold voltage, for example, a manufacturing process condition such as channel doping is changed.

Examples of the logic circuit 20L in the shutdown region 20 include a central processing unit (CPU), an error correction code (ECC) circuit, and an encryption circuit block.

In addition, a static random access memory (SRAM) may be mounted in the shutdown region 20.

(Waveforms)

FIG. 4 is a diagram illustrating waveforms of the voltage VDDI applied to the shutdown region 20 via the PSWs 10 and the switch signals. In FIG. 4, the curve P1 represents the waveform output from the PSWs 10.

As illustrated in FIG. 4, first, at a timing 0, the input signal EN_0 is input to PSW $10_0$, and the switch QPO in PSW $10_0$ is turned on. Then, the input signals EN_1, ..., and EN_n are sequentially input to PSW $10_1, \ldots,$ and $10_n$, and the switches QPOs in PSW $10_1, \ldots,$ and $10_n$ are sequentially turned on. Then, at a timing T when a current is sufficiently supplied to the circuit, the voltage in the shutdown region 20 reaches a predetermined voltage VDDI.

(TIE Cell)

Figure 21A:
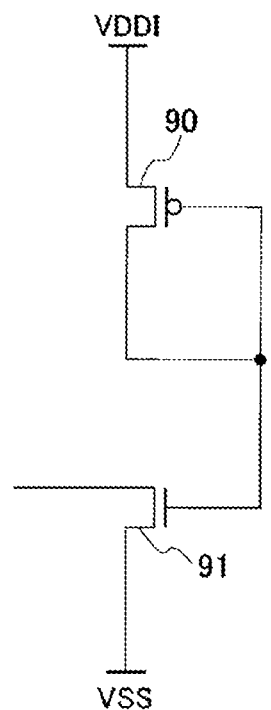
FIG. 21A is a diagram illustrating a comparative example of a TIE-low cell.
Figure 21B:
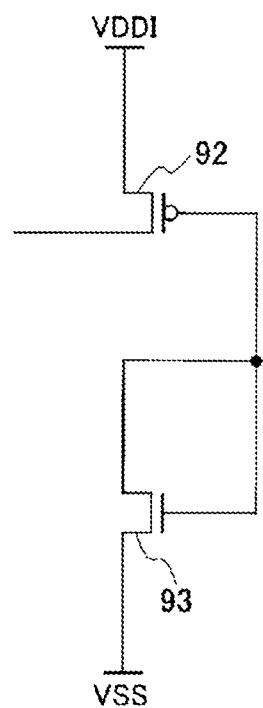
FIG. 21B is a diagram illustrating a comparative example of a TIE-high cell.

When the power supply is connected directly to an unused or desired input terminal of the logic circuit so as to fix the voltage of the input terminal, the input terminal is a gate of a transistor in many cases, and thus, the power supply is connected directly to the gate of the transistor. As a result, the ESD resistance becomes weak. In order to enhance the ESD resistance, it is effective to insert a resistance between the power supply and the gate of the transistor. However, since many transistors are arranged in the logic circuit, the insertion of resistance elements such as polysilicon other than transistors affects the performance of the surrounding transistors. Thus, a TIE cell in which a resistance is made up by a transistor may be used, and the power supply may be connected to an unused input terminal of the logic circuit or an input terminal of the logic circuit of which voltage is desired to be fixed, via the TIE cell. However, as represented in the comparative example of FIGS. 21A and 21B, in TIE cells where gates of transistors are not connected to the power supply, gates of PMOSFETs 90 and 92 and NMOSFETs 91 and 93 are floating and have a high impedance. Hence, a high level and a low level are not output immediately when the power of the shutdown region is turned ON. For example, as illustrated in FIG. 21A, in the TIE-low cell, since the NMOSFET 91 is turned ON by making the floating region go into the high level by a subthreshold leakage current of the PMOSFET 90, the low level is not output immediately when the power of the shutdown region is turned ON. As illustrated in FIG. 21B, in the TIE-high cell, since the PMOSFET 92 is turned ON by making the floating region go into the low level with a subthreshold leakage current of the NMOSFET 93, the high level is not output immediately when the power of the shutdown region is turned ON.

Figure 5A:
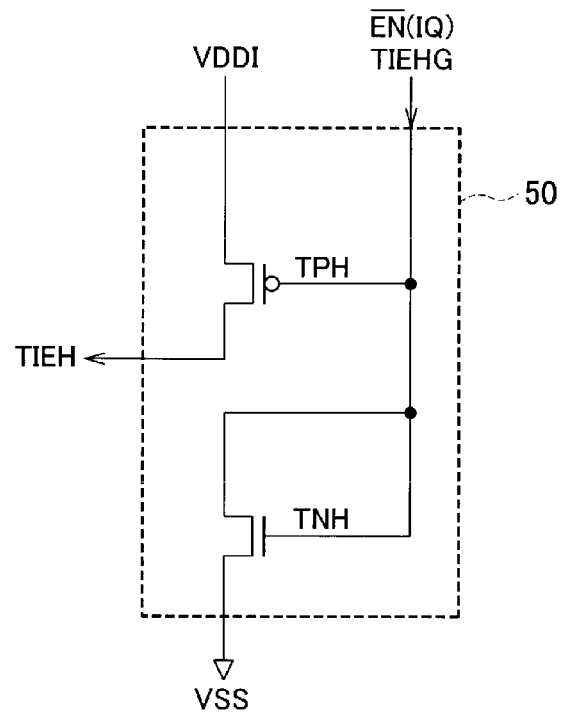
FIG. 5A is a circuit diagram of a TIE-high cell mounted in a semiconductor integrated circuit.
Figure 5B:
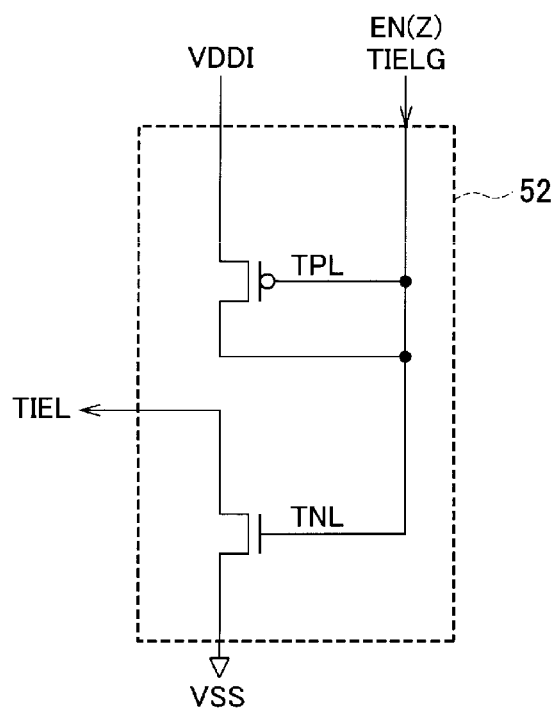
FIG. 5B is a circuit diagram of a TIE-low cell mounted in a semiconductor integrated circuit.

FIG. 5A is a circuit diagram of a TIE-high cell 50 mounted in the semiconductor integrated circuit 100. FIG. 5B is a circuit diagram of a TIE-low cell 52 mounted in the semiconductor integrated circuit 100.

The TIE-high cell 50 is a circuit that outputs a high level and is connected to the logic circuit or the like to fix an input signal to the logic circuit to the high level. Further, the TIE-low cell 52 is a circuit that outputs a low level and is connected to the logic circuit or the like to fix an input signal to the logic circuit to the low level.

As illustrated in FIG. 5A, the TIE-high cell 50 includes an NMOSFET TNH of which source is connected to a low level power supply VSS and of which gate is short-circuited with a drain thereof, and a PMOSFET TPH of which source is connected to a high level power supply (second power VDDI) and of which gate is connected to the gate of NMOSFET TNH. Here, when a low level gate signal TIEHG(EN(IQ)) is supplied to the gate of the PMOSFET TPH, the NMOSFET TNH enters into an OFF state, and the PMOSFET TPH enters into an ON state. Thus, a high level TIEH is output from the drain of the MOSFET TPH.

As illustrated in FIG. 5B, the TIE-low cell 52 includes a PMOSFET TPL of which source is connected to a high level power supply (second power VDDI) and of which gate is short-circuited with a drain thereof, and an NMOSFET TNL of which source is connected to a low level power supply VSS and of which gate is connected to the gate of PMOSFET TPL. Here, when a high level gate signal TIELG(EN(Z)) is supplied to the gate of the PMOSFET TPL, the PMOSFET TPL enters into an OFF state, and the NMOSFET TNL enters into an ON state. Thus, a low level TIEL is output from the drain of the NMOSFET TNL.

Figure 6:
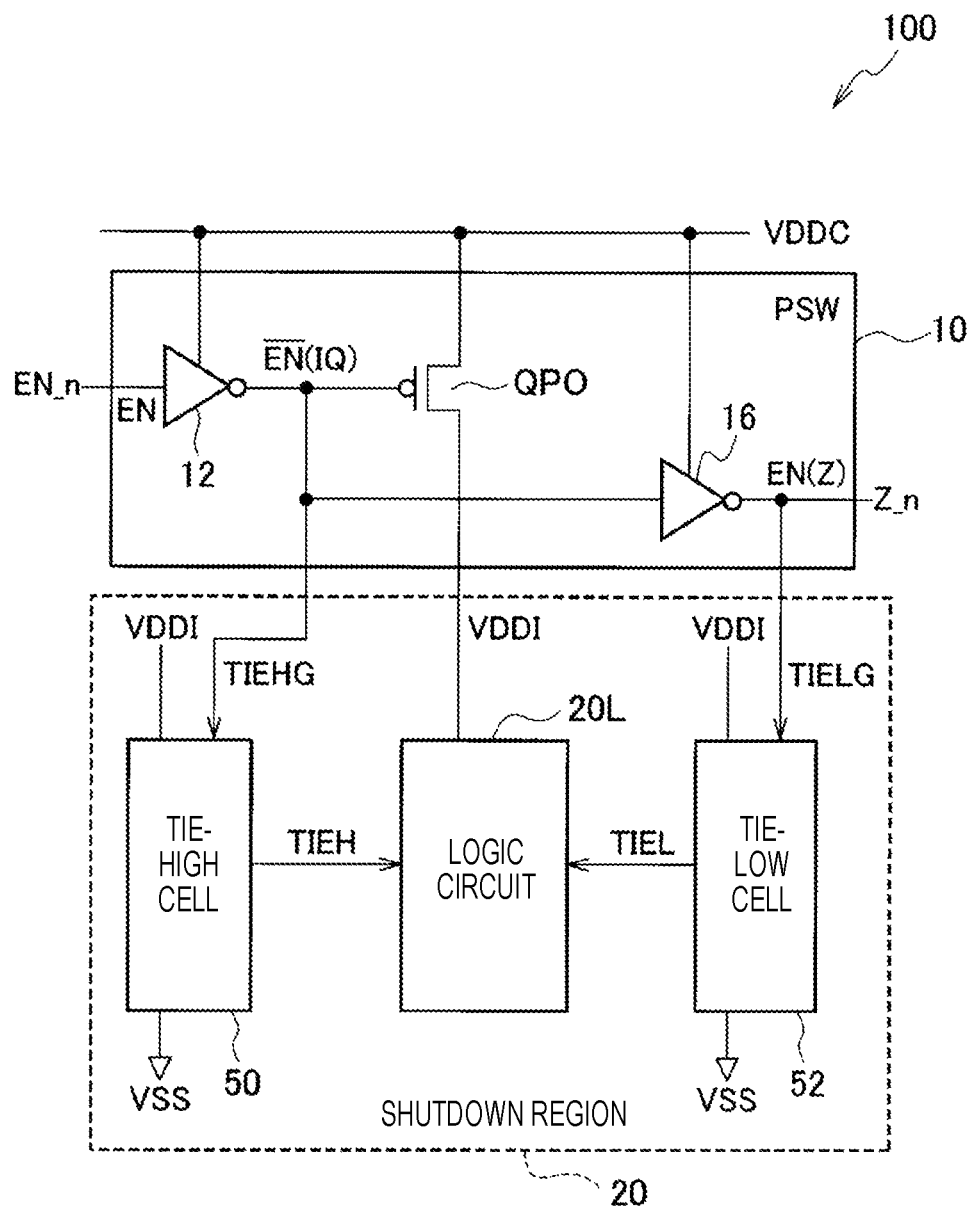
FIG. 6 is a circuit diagram of a semiconductor integrated circuit.

As illustrated in FIG. 6, the semiconductor integrated circuit 100 according to the first embodiment includes the first power line VDDC, the second power line VDDI, the power switch cell PSW 10, the logic circuit 20L, a first circuit 50, and a second circuit 52.

The first power line VDDC supplies a first power to the energization region 30.

The second power line VDDI supplies a second power to the shutdown region 20.

The PSW 10 is disposed between the first power line VDDC and the second power line VDDI, and supplies the second power from the first power line VDDC to the second power line VDDI in response to the input signal EN.

The logic circuit 20L is disposed in the shutdown region 20, and connected to the second power line VDDI.

The first circuit 50 is connected to the second power line VDDI, outputs the high level TIEH to the logic circuit 20L in response to a gate input TIEHG which is an inverted signal $\overline{EN}$(IQ) of the input signal EN, and fixes the first input to the logic circuit 20L to the high level.

The second circuit 52 is connected to the second power line VDDI, outputs the low level TIEL to the logic circuit 20L in response to a gate input TIELG which is an inverted signal EN(Z) of an inverted signal $\overline{EN}$, and fixes the second input to the logic circuit 20L to the low level.

Here, the first circuit 50 includes a TIE-high cell, and the second circuit 52 includes a TIE-low cell.

In the semiconductor integrated circuit 100 according to the first embodiment, since the voltage of the floating portion of the TIE cell is instantaneously fixed when the shutdown region is turned ON, the TIE cell may also instantaneously output the high level or the low level.

A threshold voltage of a MOS transistor used in the power switch cell PSW 10 is set to be higher than a threshold voltage of a MOS transistor used in the logic circuit 20L.

(MTCMOS)

In the semiconductor integrated circuit 100 according to the first embodiment, a multi-threshold (MT) CMOS power switch cell may be used for PSW 10. In the semiconductor integrated circuit 100 according to the first embodiment, an MTCMOSFET having two or more high and low threshold voltages is used in a CMOS process, so that a high speed operation is implemented with a logic circuit having a low threshold voltage during an operation, and a current leakage reduction is implemented with a PSW power switch transistor having a high threshold voltage during a standby. The PSW is implemented by a high threshold MOSFET, and the logic circuit disposed inside the shutdown region 20 is implemented by a low threshold MOSFET. The TIE-high cell and the TIE-low cell are also provided in the low threshold MOSFET logic circuit inside the shutdown region 20.

The semiconductor integrated circuit 100 according to the first embodiment supplies an enable signal of the MTCMOS power switch cell to the floating portions of the TIE-high cell and the TIE-low cell inside the shutdown region 20. Further, the enable signal of the MTCMOS power switch cell may be supplied as a TIE-high signal or a TIE-low signal inside the shutdown region 20.

(Waveforms of Operation Signals)

FIGS. 7A to 7E are diagrams illustrating waveforms of operation signals in the semiconductor integrated circuit 100 according to the first embodiment.

Figure 7A:
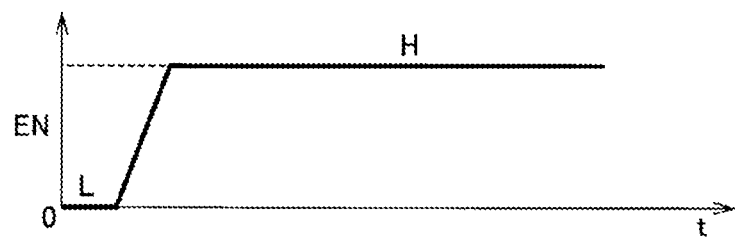
FIG. 7A is a diagram illustrating an input signal EN to a power switch cell of a semiconductor integrated circuit.
Figure 7B:
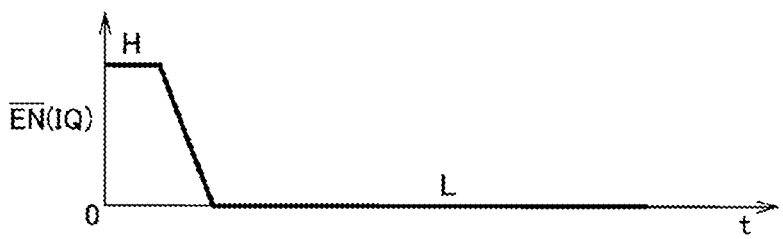
FIG. 7B is a diagram illustrating an output signal $\overline{EN}(IQ)$ from an inverter gate in the power switch cell.
Figure 7C:
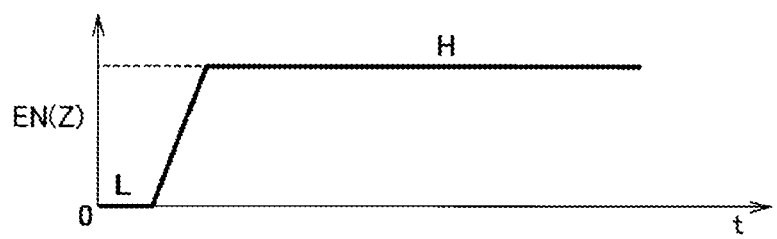
FIG. 7C is a diagram illustrating an output signal EN(Z) from another inverter gate in the power switch cell.

As illustrated in FIG. 7A, when the input signal EN of a PSW 10 shifts from a low level L to a high level H, the output IQ of the inverter gate 12 becomes the inverted signal $\overline{EN}$(IQ), and shifts from the high level H to the low level L as illustrated in FIG. 7B. The output Z of the inverter gate 16 becomes the inverted signal EN(Z) of the inverted signal $\overline{EN}$, and shifts from the low level L to the high level H as illustrated in FIG. 7C.

The inverted signal $\overline{EN}$(IQ) becomes the gate input signal TIEHG of the TIE-high cell 50.

When the gate input signal TIEHG shifts from the high level H to the low level L, the PMOSFET TPH of the TIE-high cell 50 shifts from the OFF state to the ON state, and the NMOSFET TNM of the TIE-high cell 50 shifts from the ON state to the OFF state.

Figure 7D:
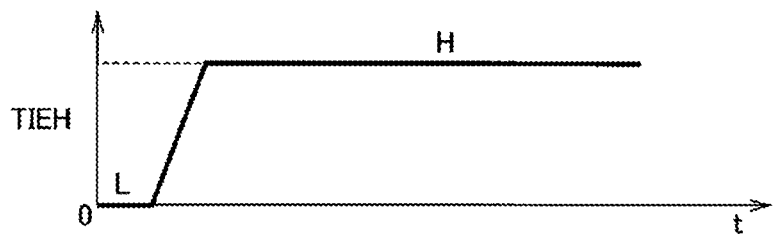
FIG. 7D is a diagram illustrating an output signal TIEH from a TIE-high cell.

As a result, as illustrated in FIG. 7D, the high level TIEH is output from the drain of the PMOSFET TPH of the TIE-high cell 50.

The inverted signal EN(Z) of the inverted signal EN becomes the gate input signal TIELG of the TIE-low cell 52.

When the gate input signal TIELG shifts from the low level L to the high level H, the PMOSFET TPL of the TIE-low cell 52 shifts from the ON state to the OFF state, and the NMOSFET TNL of the TIE-low cell 52 shifts from the OFF state to the ON state.

Figure 7E:
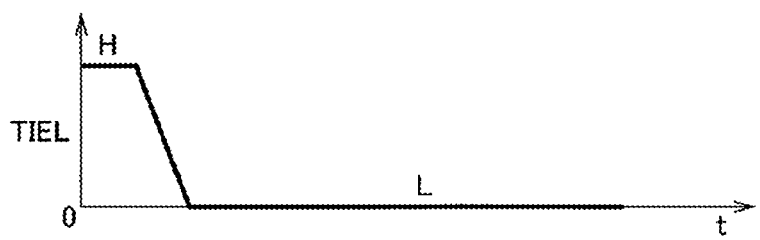
FIG. 7E is a diagram illustrating an output signal TIEL from a TIE-low cell.

As a result, as illustrated in FIG. 7E, the low level TIEL is output from the drain of the NMOSFET TNL of the TIE-low cell 52.

Figure 8:
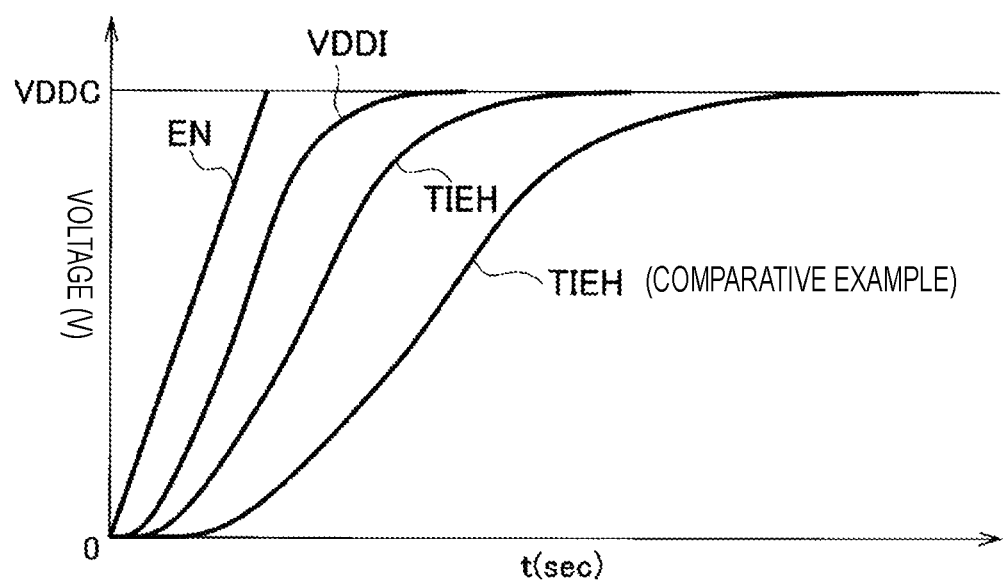
FIG. 8 is a waveform diagram of signals EN, VDDI, and TIEH.

FIG. 8 is a waveform diagram of the signals EN, VDDI, and TIEH in the semiconductor integrated circuit 100 according to the first embodiment.

First, when the input signal EN of PSW 10 becomes the high level, the output IQ of the inverter gate 12 becomes the low level, and the PMOSFET QPO enters into the ON state, so that the second power VDDI is supplied from the first power line VDDC to the shutdown region 20. The VDDI in FIG. 8 represents the rise of the voltage.

Further, when the output IQ of the inverter gate 12 becomes the low level, the gate input signal TIEHG is supplied to the gates of the PMOSFET TPH and the NMOSFET TNH of the TIE-high cell 50. As a result, as illustrated in FIG. 8, the high level output TIEH is obtained from the TIE-high cell 50. The TIEH in FIG. 8 represents the rise of the high level output voltage.

The waveform of TIEH(Comparative Example) represents an example where the gate input signal TIEHG is not input. That is, in the comparative example, when a signal is not supplied to the gates of the PMOSFET TPH and the NMOSFET TNH of the TIE-high cell 50, and the second power VDDI rises in the floating state, the gates of the PMOSFET TPH and the NMOSFET TNH gradually become the low level due to the subthreshold leakage current between the source and the drain of the NMOSFET TNH, and the PMOSFET TPH gradually enters into the ON state according to the gate signal. As a result, the high level output is obtained as represented in the TIEH(Comparative Example) of FIG. 8. As shown in FIG. 8, when the gate input signal TIEHG is supplied, the response speed is faster than that in the comparative example where the gates are in the floating state.

The first power VDDC of the always-ON power supply is constant at all times. When the input signal EN shifts to the high level, the low level signal $\overline{EN}$(IQ) is output via the inverter gate 12 of the PSW 10, the PMOSFET QPO of the PSW 10 is turned ON, and the second power VDDI is output.

When the second power VDDI becomes the power of the TIE-high cell 50, so that the floating portion in the TIE-high cell 50 shifts to the low side due to the leak of the NMOSFET TNH and reaches a circuit threshold value at which the PMOSFET TPH of the TIE-high cell is turned ON, the TIE-high cell outputs the high level. In the semiconductor integrated circuit 100 according to the first embodiment, since $\overline{EN}$(IQ) is supplied to the floating portion, the floating portion already reaches the circuit threshold value when the TIE-high cell 50 is turned ON, and thus, the PMOSFET TPH of the TIE-high cell 50 is immediately turned ON. As a result, the response speed is relatively fast.

When the second power VDDI becomes the power of the TIE-low cell 52, so that the floating portion in the TIE-low cell 52 shifts to the high side due to the leak of the PMOSFET TPL and reaches a circuit threshold value at which the NMOSFET TNL of the TIE-low cell 52 is turned ON, the TIE-low cell 52 outputs the low level. In the semiconductor integrated circuit 100 according to the first embodiment, since the signal EN(Z) is supplied to the floating portion, the floating portion already reaches the circuit threshold value when the TIE-low cell 52 is turned ON, and thus, the NMOSFET TNL of the TIE-low cell 52 is immediately turned ON. As a result, the response speed is relatively fast.

In addition, while only one PSW 10 is indicated in the above descriptions with reference to FIG. 6, a plurality of PSWs 10 may be arranged in the semiconductor integrated circuit 100 as shown in FIGS. 1A and 1B.

(Example where a Plurality of TIE-High Cells, a Plurality of TIE-Low Cells, and a Plurality of Logic Cells are Disposed)

Figure 9:
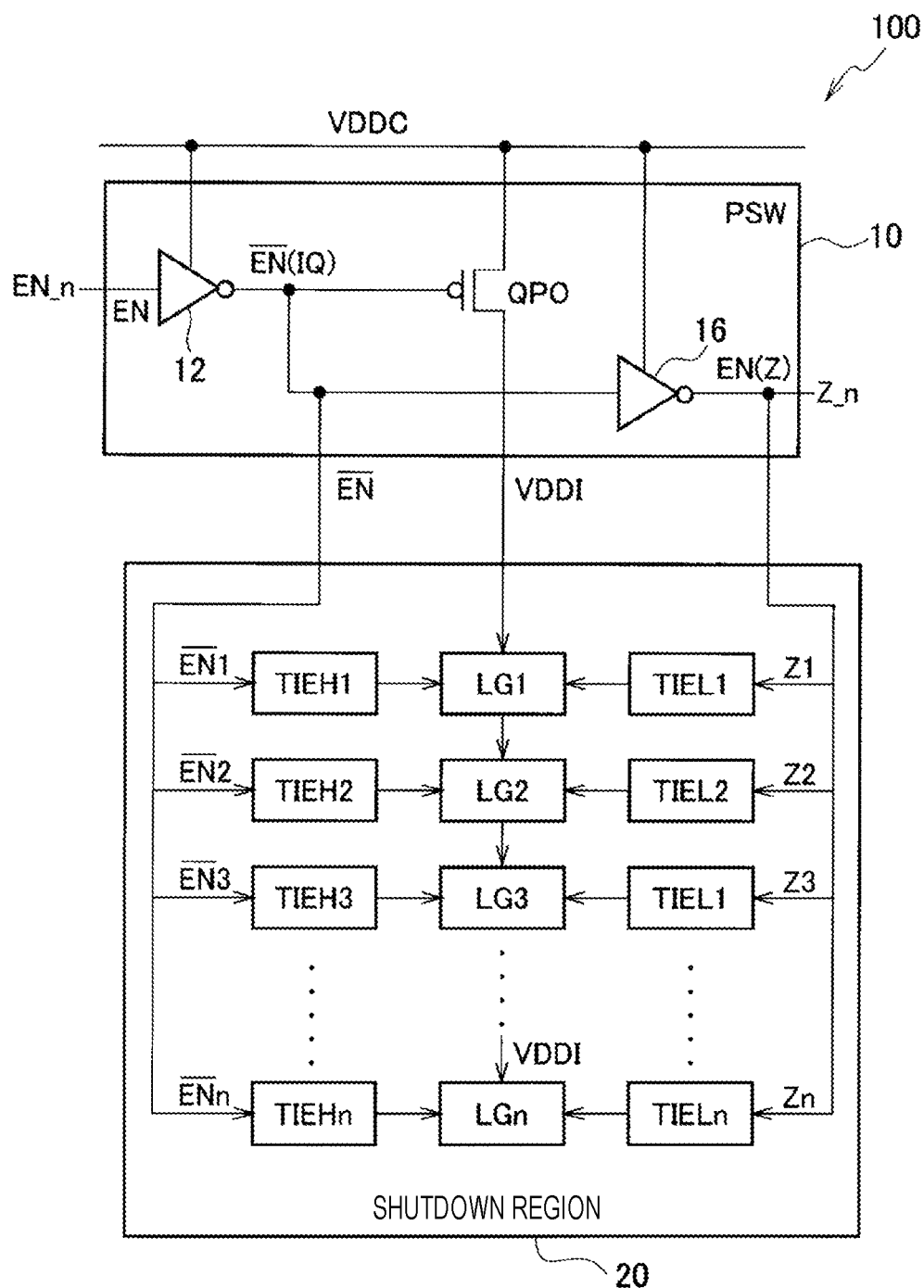
FIG. 9 is a circuit diagram illustrating a plurality of TIE-high cells, a plurality of TIE-low cells, and a plurality of logic circuits disposed inside a shutdown region of a semiconductor integrated circuit.

FIG. 9 is a circuit diagram of a plurality of TIE-high cells, a plurality of TIE-low cells, and a plurality of logic circuits disposed inside the shutdown region 20 in the semiconductor integrated circuit 100 according to the first embodiment.

As illustrated in FIG. 9, a total of n logic circuits (logic circuits LG1, LG2, LG3, . . . , and LGn) is disposed in the shutdown region 20. The second power VDDI is supplied to each of the logic circuits LG1, LG2, LG3, . . . , and LGn.

In addition, TIE-high cells TIEH1, TIEH2, TIEH3, . . . , and TIEHn and TIE-low cells TIEL1, TIEL2, TIEL3, . . . , TIELn are disposed in association with the logic circuits LG1, LG2, LG3, . . . , and LGn, respectively. The second power VDDI is supplied to each of the TIE-high cells TIEH1, TIEH2, TIEH3, . . . , and TIEHn and the TIE-low cells TIEL1, TIEL2, TIEL3, . . . , and TIELn.

Here, inverted signals $\overline{EN}$1, $\overline{EN}$2, $\overline{EN}$3, . . . , and $\overline{EN}$n are supplied to the TIE-high cells TIEH1, TIEH2, TIEH3, . . . , and TIEHn, respectively, and output signals Z1, Z2, Z3, . . . , and Zn are supplied to the TIE-low cells TIEL1, TIEL2, TIEL3, . . . , and TIELn, respectively.

As for the logic circuits LG1, LG2, LG3, . . . , and LGn, a CPU, an ECC circuit, an encryption circuit block, an SRAM or the like may be utilized.

As for the TIE-high cells TIEH1, TIEH2, TIEH3, . . . , and TIEHn, the TIE-high cell 50 illustrated in FIG. 5A may be utilized.

As for the TIE-low cells TIEL1, TIEL2, TIEL3, . . . , and TIELn, the TIE-low cell 52 illustrated in FIG. 5B may be utilized.

(Example of a PSW Disposed Inside the Shutdown Region)

Figure 10:
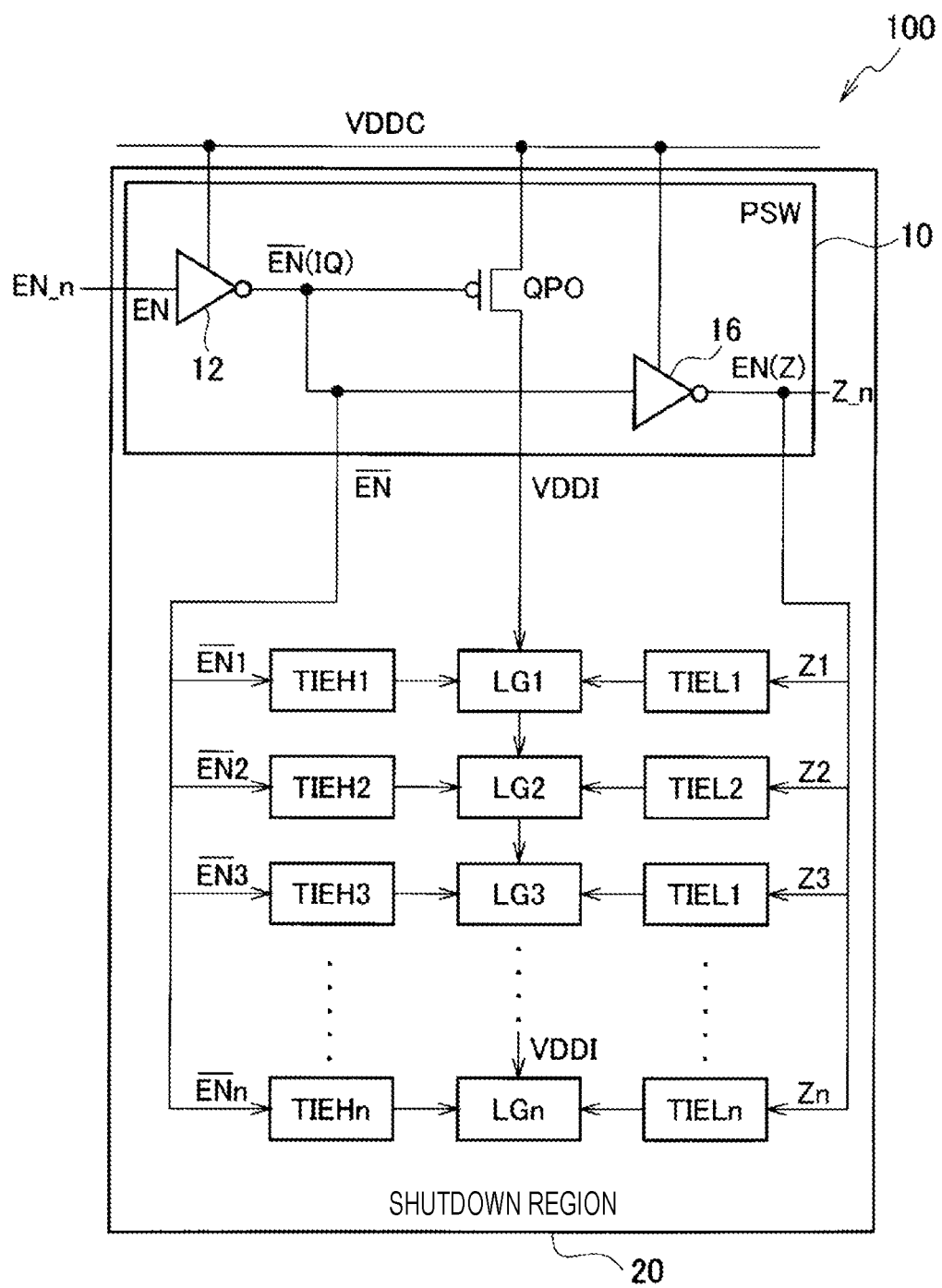
FIG. 10 is a circuit diagram of a PSW disposed inside a shutdown region of a semiconductor integrated circuit.

FIG. 10 is a circuit diagram of the PSW 10 disposed inside the shutdown region 20 of the semiconductor integrated circuit according to the first embodiment.

As illustrated in FIG. 9, the logic circuits LG1, LG2, LG3, . . . , and LGn are disposed in the shutdown region 20. The second power VDDI is supplied to each of the "n" logic circuits LG1, LG2, LG3, . . . , and LGn.

In addition, while an example where one PSW 10 is disposed has been described, a plurality of PSWs 10 may be disposed.

Second Embodiment

Figure 11:
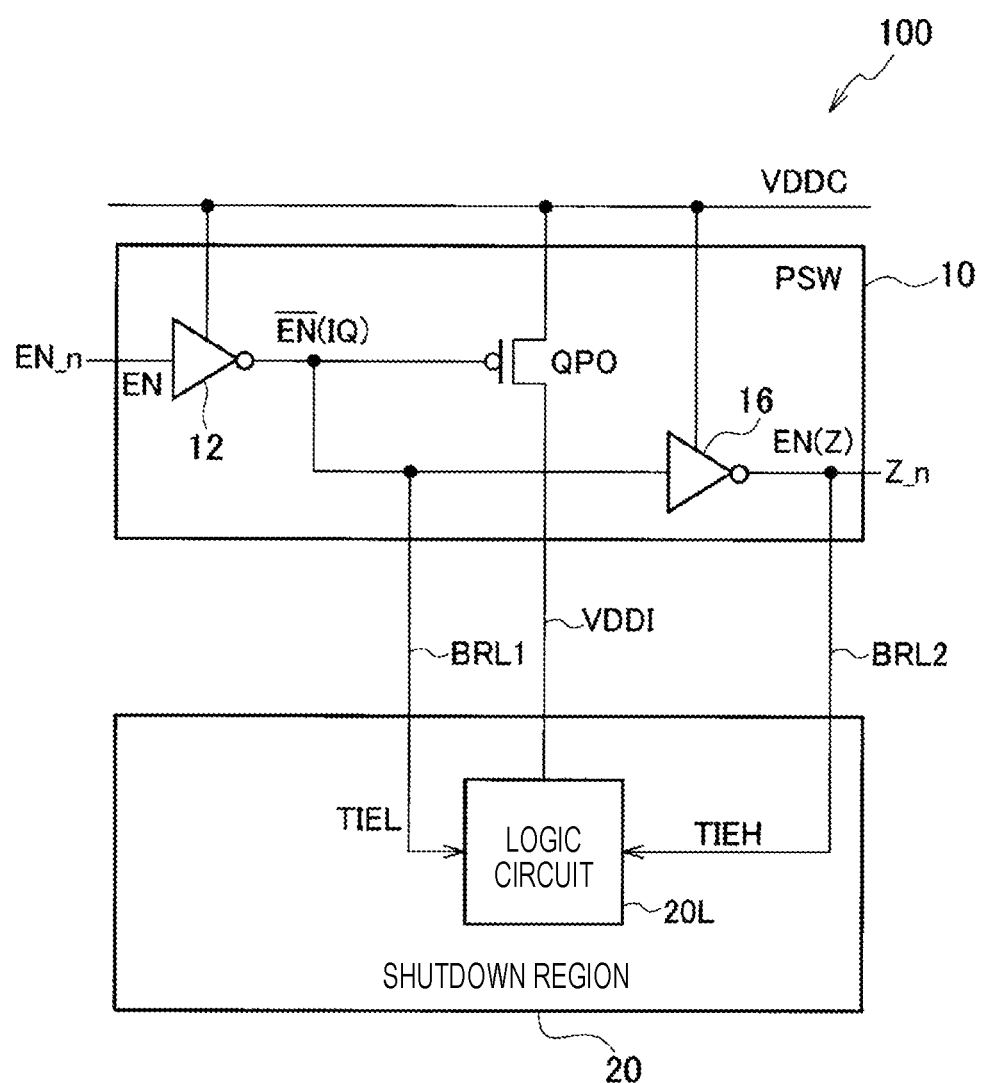
FIG. 11 is a circuit diagram of a semiconductor integrated circuit according to a second embodiment.

As illustrated in FIG. 11, a semiconductor integrated circuit 100 according to a second embodiment includes a first power line VDDC, a second power line VDDI, and a power switch cell PSW 10.

The first power line VDDC supplies the first power to the energization region 30.

The second power line VDDI supplies the second power to the shutdown region 20.

The PSW 10 is disposed between the first power line VDDC and the second power line VDDI, and supplies the second power from the first power line VDDC to the second power line VDDI in response to the input signal EN.

The logic circuit 20L is disposed in the shutdown region 20 and connected to the second power line VDDI.

Here, the power switch cell PSW 10 includes a first branch line BRL1 that supplies the inverted signal $\overline{EN}$(IQ) and a second branch line BRL2 that supplies the inverted signal EN(Z) of the inverted signal $\overline{EN}$. The other configuration of PSW 10 is similar to that in the first embodiment, and the second embodiment is also similar to the first embodiment in that the threshold voltage of the MOS transistor of the PSW 10 is set to be higher than the threshold voltage of the MOS transistor of the logic circuit 20L.

The first branch line BRL1 is connected to an unused terminal of the logic circuit 20L or a terminal thereof desired to be fixed to the low level, and supplies the low level signal TIEL.

The second branch line BRL2 is connected to an unused terminal of the logic circuit 20L or a terminal thereof desired to be fixed to the high level, and supplies the high level signal TIEH that corresponds to the inverted signal EN(Z) of the inverted signal $\overline{EN}$.

In the semiconductor integrated circuit 100 according to the second embodiment, the enable signal of the PSW 10 is directly used for the TIE signal without using the TIE cell, as illustrated in FIG. 11. As for the enable signal of the PSW 10, a signal having the same phase as that of the TIE signal is used. When the PSW 10 is a PMOSFET, the enable signal connected to the gate of the PMOSFET when the PSW 10 is turned ON has the same phase as that of TIEL, and the enable signal connected to the subsequent stage has the same phase as that of TIEH. Here, the enable signals correspond to the output signals $\overline{EN}$(IQ) and EN(Z) of the inverter gates 12 and 16.

In the semiconductor integrated circuit 100 according to the second embodiment, the TIEH and TIEL outputs can be supplied to the logic circuit 20L without using any TIE cell. Since the enable signal is not directly connected to the power supply, the countermeasure against the ESD is also provided. Since the PSW 10 is disposed around or inside the shutdown region 20, the PSW 10 may be easily connected to the logic circuit 20L.

(Waveforms of Operation Signals)

Examples of waveforms of operation signals in the semiconductor integrated circuit 100 according to the second embodiment are explained with reference to FIGS. 7A to 7E.

As illustrated in FIG. 7A, when the input signal EN to the PSW 10 shifts from the low level L to the high level H, the output IQ from the inverter gate 12 becomes the inverted signal $\overline{EN}$(IQ), and shifts from the high level H to the low level L as illustrated in FIG. 7B. The output Z of the inverter gate 16 becomes the inverted signal EN(Z) of the inverted signal $\overline{EN}$, and shifts from the low level L to the high level H as illustrated in FIG. 7C.

As illustrated in FIG. 7E, the low level signal TIEL is supplied to the logic circuit 20L in response to the inverted signal $\overline{EN}$(IQ).

Further, as illustrated in FIG. 7D, the high level signal TIEH is supplied to the logic circuit 20L in response to the inverted signal EN(Z) of the inverted signal $\overline{EN}$(IQ).

Figure 12:
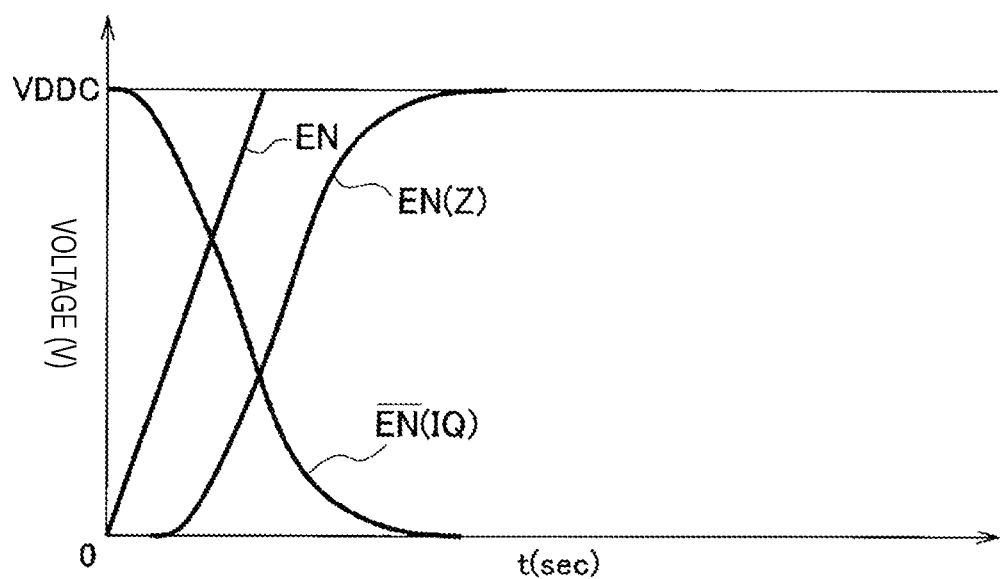
FIG. 12 is a waveform diagram of signals EN, EN(Z), and $\overline{EN}(IQ)$ according to a second embodiment.

FIG. 12 is a waveform diagram of signals EN, EN(Z), and $\overline{EN}$(IQ) in the semiconductor integrated circuit 100 according to the second embodiment.

When the input signal EN of the PSW 10 becomes the high level, the waveform represented by the inverted signal $\overline{EN}$(IQ) of the input signal EN is obtained from the output IQ of the inverter gate 12, as illustrated in FIG. 12.

In addition, when the input signal EN becomes the high level, the output IQ from the inverter gate 12 becomes the low level, and the PMOSFET QPO enters into the ON state, so that the second power VDDI is supplied from the first power line VDDC to the shutdown region 20. The waveform of the second power VDDI is the same as that in FIG. 8.

In addition, when the output IQ of the inverter gate 12 becomes the low level, the waveform represented by the inverted signal EN(Z) of the inverted signal EN is obtained from the output Z of the inverter gate 16 as illustrated in FIG. 12.

(Circuit Operation of Second Embodiment)

Figure 13:
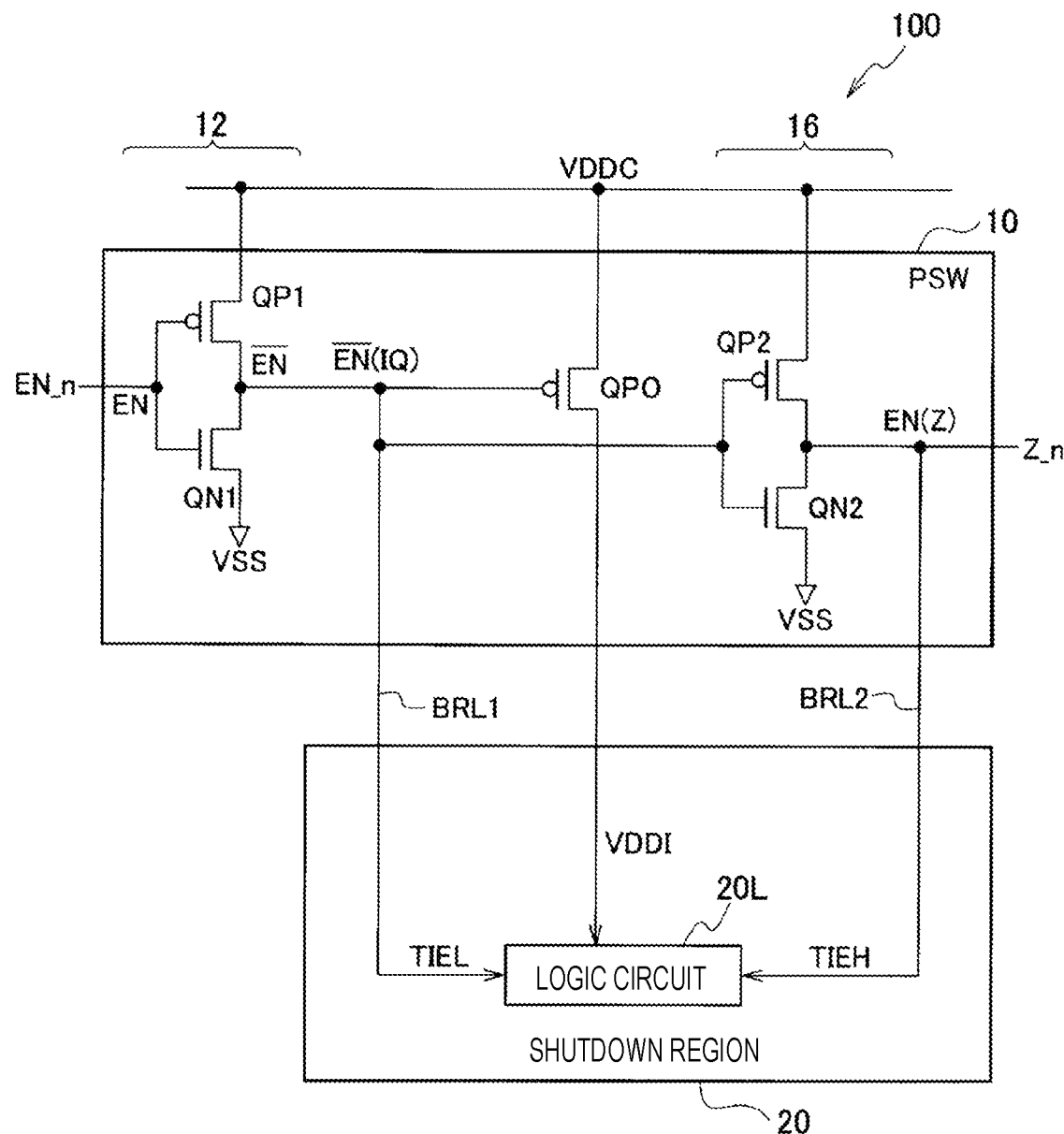
FIG. 13 is a circuit diagram of two inverter gates in a power switch cell and a logic circuit in a shutdown region of the semiconductor integrated circuit according to a second embodiment.

FIG. 13 is a circuit diagram of the two inverter gates 12 and 16 in the PSW 10 and the logic circuit 20L in the shutdown region 20 in the semiconductor integrated circuit 100 according to the second embodiment.

As illustrated in FIG. 13, the first inverter gate 12 can be represented by a CMOS configuration including a PMOSFET QP1 and an NMOSFET QN1, and the second inverter gate 16 can be represented by a CMOS configuration including a PMOSFET QP2 and an NMOSFET QN2.

When the input signal EN becomes the high level, the inverted signal $\overline{EN}$(IQ) is obtained from the output IQ of the inverter gate 12. At this time, since the PMOSFET QP1 enters into the OFF state and the NMOSFET QN1 enters into the ON state, the low level signal TIEL is supplied to the logic circuit 20L via the first branch line BRL1. When a power charge occurs due to the ESD in the low level power line VSS, the logic circuit 20L can be protected from the ESD by the resistance between the source and the drain of the NMOSFET QN1 in the ON state.

When the output IQ of the inverter gate 12 becomes the low level, the output from the inverter gate 16 becomes the high level, and the output signal EN(Z) is obtained. At this time, since the PMOSFET QP2 enters into the ON state and the NMOSFET QN2 enters into the OFF state, the high level signal TIEH is supplied to the logic circuit 20L via the second branch line BRL2. When a power charge occurs due to the ESD in the power line VDDC, the logic circuit 20L can be protected from the ESD by the resistance between the source and the drain of the PMOSFET QP2 in the ON state.

(Example where a Plurality of Logic Circuits is Disposed)

Figure 14:
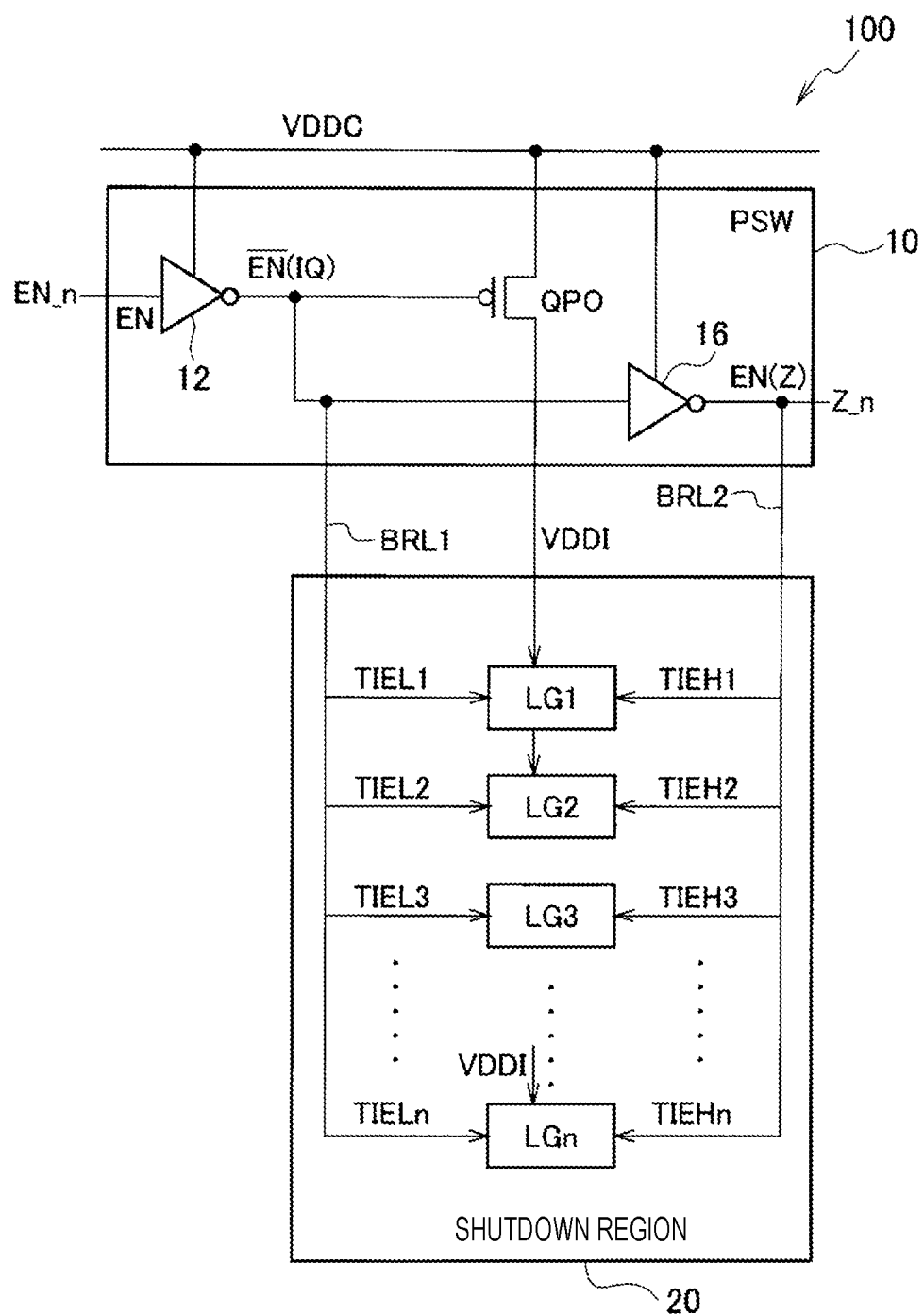
FIG. 14 is a circuit diagram of a plurality of logic circuits disposed inside a shutdown region of a semiconductor integrated circuit according to a second embodiment.

FIG. 14 is a circuit diagram of a plurality of logic circuits disposed inside the shutdown region 20 in the semiconductor integrated circuit 100 according to the second embodiment.

As illustrated in FIG. 14, the logic circuits LG1, LG2, LG3, . . . , and LGn are disposed in the shutdown region 20. The second power VDDI is supplied to each of the logic circuits LG1, LG2, LG3, . . . , and LGn.

Further, the low level signals TIEL1, TIEL2, TIEL3, . . . , and TIELn and the high level signals TIEH1, TIEH2, TIEH3, . . . , and TIEHn are supplied in association with the logic circuits LG1, LG2, LG3, . . . , and LGn, respectively.

Here, the low level signals TIEL1, TIEL2, TIEL3, . . . , and TIELn correspond to the inverted signal $\overline{\text{EN}}$(IQ) obtained from the output IQ of the inverter gate 12, and the high level signals TIEH1, TIEH2, TIEH3, . . . , and TIEHn correspond to the output signal EN(Z) of the inverter gate 16.

In addition, while only one PSW 10 is indicated in the above descriptions, a plurality of PSW 10 may be disposed in the semiconductor integrated circuit 100.

Third Embodiment

Figure 15:
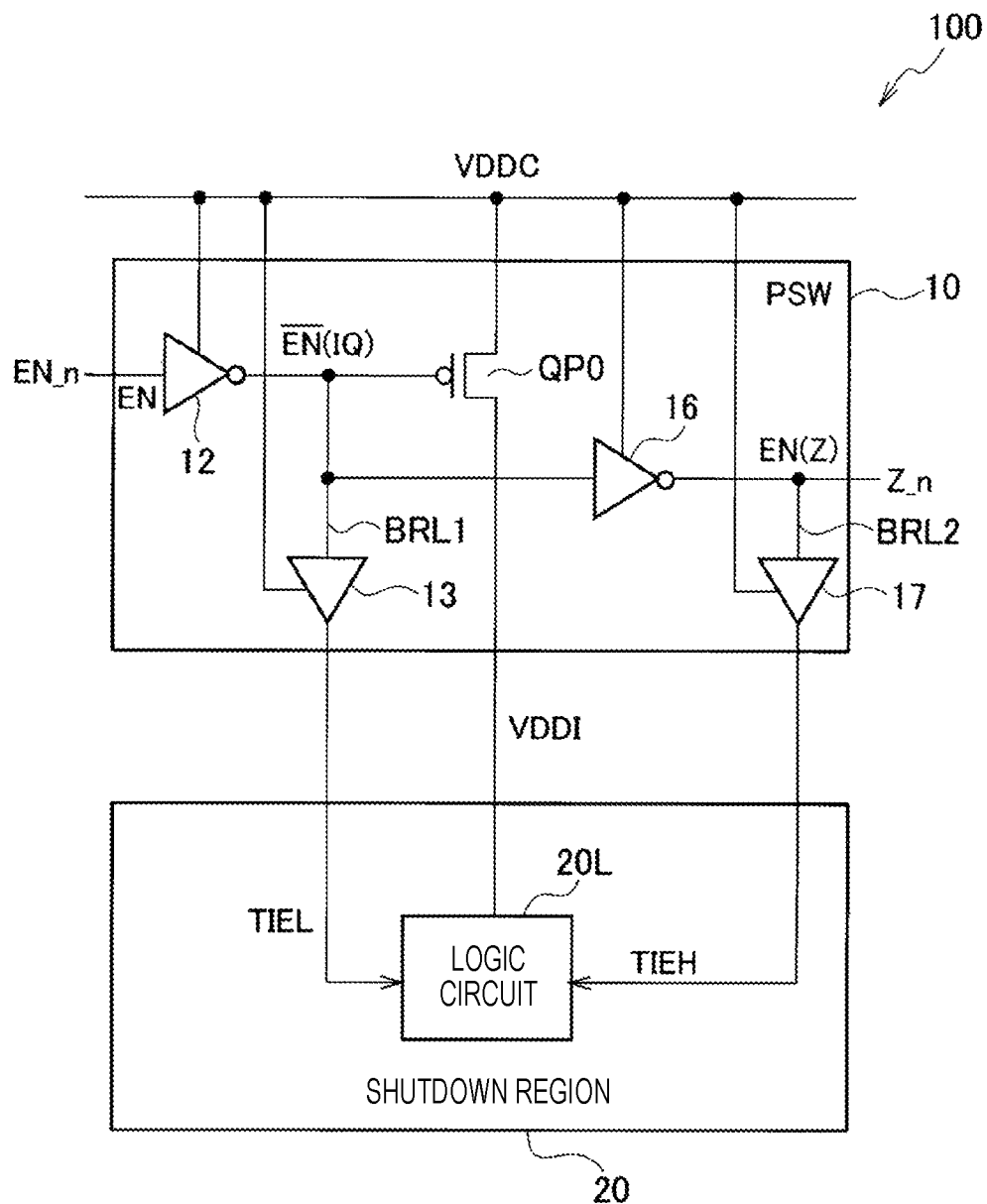
FIG. 15 is a circuit diagram of a semiconductor integrated circuit according to a third embodiment.

As illustrated in FIG. 15, a semiconductor integrated circuit 100 according to a third embodiment includes a first power line VDDC, a second power line VDDI, and a power switch cell PSW 10.

The first power line VDDC supplies the first power to the energization region 30.

The second power line VDDI supplies the second power to the shutdown region 20.

The PSW 10 is disposed between the first power line VDDC and the second power line VDDI, and supplies the second power from the first power line VDDC to the second power line VDDI in response to the input signal EN.

The logic circuit 20L is disposed in the shutdown region 20 and connected to the second power line VDDI.

Here, the power switch cell PSW 10 includes the first branch line BRL1 that supplies the inverted signal $\overline{\text{EN}}$ and the second branch line BRL2 that supplies the inverted signal EN(Z) of the inverted signal $\overline{\text{EN}}$. The other configuration of PSW 10 is similar to that of the first embodiment, and the third embodiment is also similar to the first embodiment in that the threshold voltage of the MOS transistor of PSW 10 is set to be higher than the threshold voltage of the MOS transistor of the logic circuit 20L.

The first branch line BRL1 is connected to an unused terminal of the logic circuit 20L or a terminal thereof desired to be fixed to the low level, and supplies the low level signal TIEL.

The second branch line BRL2 is connected to an unused terminal of the logic circuit 20L or a terminal thereof desired to be fixed to the high level, and supplies the high level signal TIEH that corresponds to the inverted signal EN(Z) of the inverted signal $\overline{\text{EN}}$.

In the semiconductor integrated circuit 100 according to the third embodiment, as illustrated in FIG. 15, the PSW 10 includes a first buffer gate 13 that is connected to the first power line VDDC and connected to the first branch line BRL1 to supply an output in response to the inverted signal $\overline{\text{EN}}$(IQ) of the input signal, and a second buffer gate 17 that is connected to the first power line VDDC and connected to the second branch line BRL2 to supply an output in response to the output signal EN(Z).

In the semiconductor integrated circuit 100 according to the third embodiment, the PSW 10 includes the first buffer gate 13 and the second buffer gate 17, so that the inverted signal $\overline{\text{EN}}$(IQ) of the input signal is connected only to the inverter 16, the first buffer gate 13, and the PMOSFET QPO, and the inverted signal EN(Z) of the inverted signal $\overline{\text{EN}}$ is connected only to the second buffer gate 17 and the output destination of the power switch. As a result, the load of the logic circuit connected to the two signals is reduced, so that the increase in delay of the two signals can be prevented.

Further, the driving capability for the logic circuit and others connected to the first branch line BRL1 and the second branch line BRL2 can be increased.

In addition, an inverter gate may be used, instead of the first buffer gate 13 described above. In such a case, the first branch line BRL1 is connected to an unused terminal of the logic circuit 20L or a terminal thereof desired to be fixed to the high level via the inverter gate which replaces the first buffer gate 13, and thus, is able to supply the high level signal TIEH.

Similarly, an inverter gate may be used, instead of the second buffer gate 17 described above. In such a case, the second branch line BRL2 is connected to an unused terminal of the logic circuit 20L or a terminal thereof desired to be fixed to the low level via the inverter gate which replaces the second buffer gate 17, and thus, is able to supply the low level signal TIEL.

(Waveforms of Operation Signals)

Examples of waveforms of operation signals in the semiconductor integrated circuit 100 according to the third embodiment are explained with reference to FIGS. 7A to 7E.

As illustrated in FIG. 7A, when the input signal EN of the PSW 10 shifts from the low level L to the high level H, the output IQ from the inverter gate 12 becomes the inverted signal $\overline{\text{EN}}$(IQ), and shifts from the high level H to the low level L as illustrated in FIG. 7B. The output Z from the inverter gate 16 becomes the inverted signal EN(Z) of the inverted signal $\overline{\text{EN}}$, and shifts from the low level L to the high level H as illustrated in FIG. 7C.

As illustrated in FIG. 7E, the low level signal TIEL is supplied to the logic circuit 20L in response to the inverted signal $\overline{\text{EN}}$(IQ).

Further, as illustrated in FIG. 7D, the high level signal TIEH is supplied to the logic circuit 20L in response to the inverted signal EN(Z) of the inverted signal $\overline{\text{EN}}$(IQ).

Figure 16:
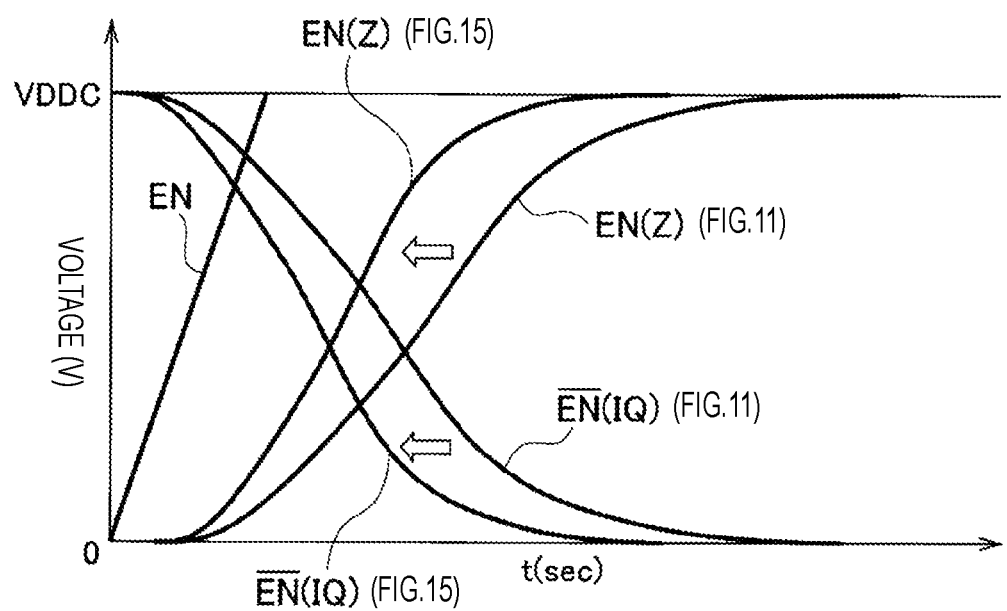
FIG. 16 is a waveform diagram of signals EN, EN(Z), and $\overline{EN}(IQ)$ according to a third embodiment.

FIG. 16 is a waveform diagram of signals EN, EN(Z), and $\overline{\text{EN}}$(IQ) in the semiconductor integrated circuit 100 according to the third embodiment.

When the input signal EN of the PSW 10 becomes the high level, the waveform represented by the inverted signal $\overline{\text{EN}}$(IQ) (FIG. 15) of the input signal EN is obtained from the output IQ of the inverter gate 12, as illustrated in FIG. 16. In addition, for a comparison, FIG. 16 represents the inverted signal of the input signal EN in the circuit of FIG. 11 as $\overline{\text{EN}}$(IQ) (FIG. 11).

Further, when the input signal EN becomes the high level, the output IQ from the inverter gate 12 becomes the low level, and the PMOSFET QPO enters into the ON state, so that the second power VDDI is supplied from the first power line VDDC to the shutdown region 20. The operation waveform of the second power VDDI is the same as that in FIG. 8.

Further, when the output IQ of the inverter gate 12 becomes the low level, the waveform represented by the inverted signal EN(Z) (FIG. 15) of the inverted signal $\overline{\text{EN}}$ is obtained from the output Z of the inverter gate 16 as illustrated in FIG. 16. In addition, for a comparison, FIG. 16 represents the inverted signal of the input signal EN in the circuit of FIG. 11, as EN(Z) (FIG. 11).

In the semiconductor integrated circuit 100 according to the third embodiment, the buffer gates 13 and 17 are added in the PSW 10 for the output of TIEL/TIEH. The load of the enable signal may increase, and thus, the propagation of the enable signal may be delayed. The buffer gate/the inverter gate are connected in the PSW 10, and the TIEL/TIEH signals are connected to the shutdown region 20. For the inverter gate, TIEL/TIEH are reversed.

As a result of the presence of the buffer gate/the inverter gate, the propagation of the enable signal of the PSW 10 is not affected by the load of the TIEL/TIEH signals in the shutdown region 20. The delay of the inverted signal $\overline{EN}$(IQ) of the input signal EN and the inverted signal EN(Z) of the inverted signal $\overline{EN}$ in FIG. 15 can be further reduced.

In the semiconductor integrated circuit 100 according to the third embodiment, it is possible to fix the influence of the load of the enable signal. That is, it is possible to cope with a case where a large number of TIEL/TIEH signals exist in the shutdown region 20.

When a large number of TIEL/TIEH signals exist in the shutdown region 20, the number of cells having unused terminals increases. However, since the unused terminals also require the ESD countermeasure, the TIE cell inputs the high level or the low level to the unused terminals.

When a large number of TIEL signals exist, a large number of loads are connected to the IQ nodes, and as a result, the delay of the IQ signals increases. On the side of the signal Z of PSW as well, when a large number of TIEH signals exist, a large number of loads are connected to the Z nodes, and as a result, the delay of the Z signals increases. In the semiconductor integrated circuit 100 according to the third embodiment, the buffer gate/the inverter gate are connected in PSW 10, so that the load of IQ and Z is reduced, and the delay of the IQ and Z signals can be reduced as illustrated in FIG. 16.

(Example where a Plurality of Logic Circuits is Disposed)

Figure 17:
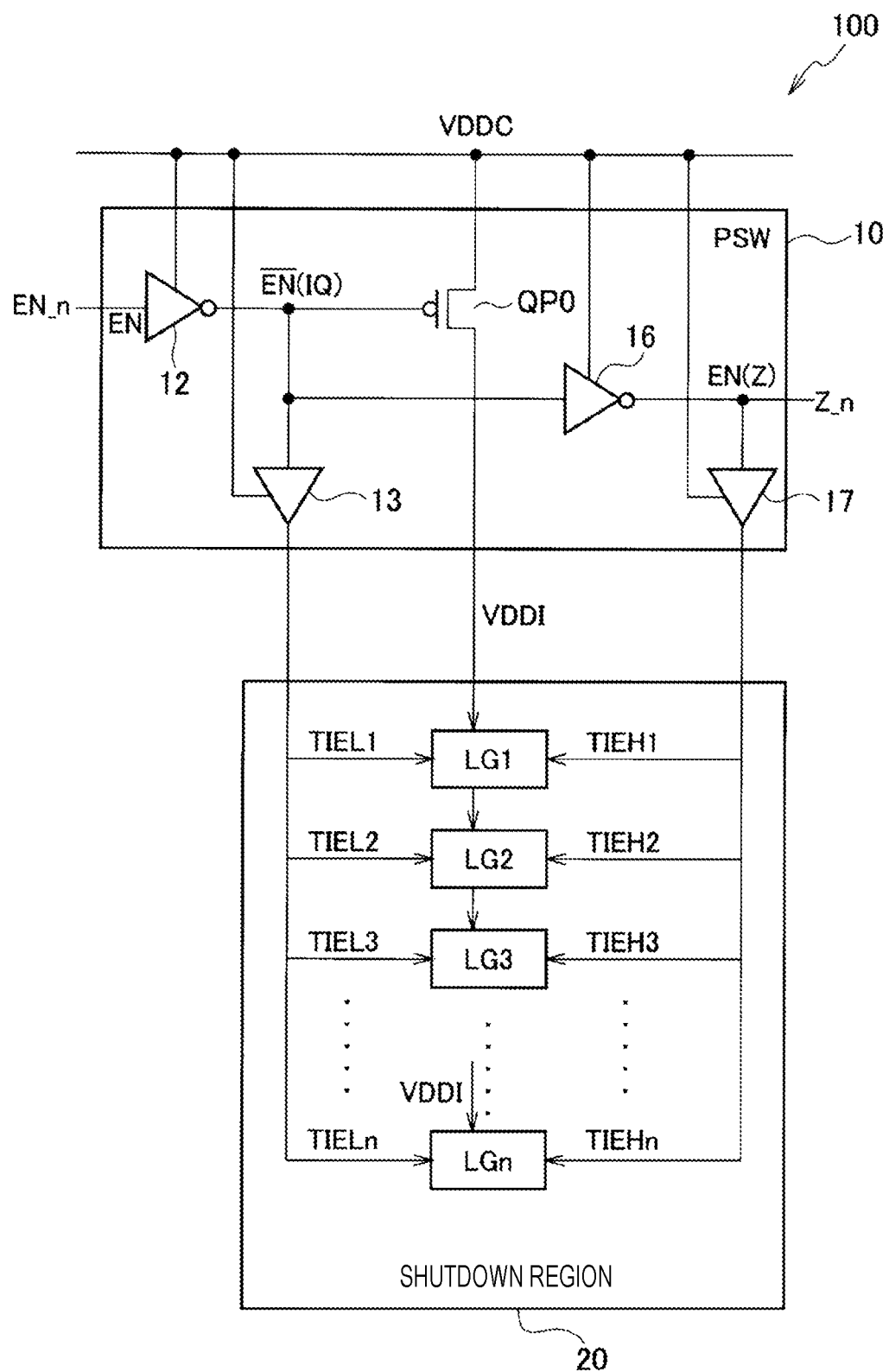
FIG. 17 is a circuit diagram illustrating a plurality of logic circuits disposed inside a shutdown region of a semiconductor integrated circuit according to a third embodiment.

FIG. 17 is a circuit diagram of a plurality of logic circuits disposed inside the shutdown region 20 in the semiconductor integrated circuit 100 according to the third embodiment.

As illustrated in FIG. 17, the logic circuits LG1, LG2, LG3, . . . , and LGn are disposed in the shutdown region 20. The second power VDDI is supplied to each of the logic circuits LG1, LG2, LG3, . . . , and LGn.

Further, the low level signals TIEL1, TIEL2, TIEL3, . . . , and TIELn and the high level signals TIEH1, TIEH2, TIEH3, . . . , and TIEHn are supplied in association with the logic circuits LG1, LG2, LG3, . . . , and LGn, respectively.

Here, the low level signals TIEL1, TIEL2, TIEL3, . . . , and TIELn correspond to the output from the first buffer gate 13 for the inverted signal $\overline{EN}$(IQ) of the inverter gate 12, and the high level signals TIEH1, TIEH2, TIEH3, . . . , and TIEHn correspond to the output from the second buffer gate 17 for the output signal EN(Z) of the inverter gate 16.

In addition, while an example where one PSW 10 is disposed has been described, a plurality of PSW 10 may be disposed.

Specific Examples

The use of the TIE cell will be described. In a logic circuit or a memory circuit, an unused input terminal often exists, and such a terminal generally needs to be fixed to the high level or the low level. In addition, an input signal may be desired to be fixed to the high level or the low level. In most cases, an input terminal is a gate of a MOS transistor. The oxide film of the gate of the MOS transistor has become thinner over the process generations near continuous of decreasing of transistor size, and thus, now tends to be easily destroyed when a charge is applied due to ESD or the like. Thus, in order to fix the gate to the high level or the low level, the power needs to be supplied via a resistor. The TIE-high cell outputs a high level signal via an ON resistance of the PMOS transistor, and the TIE-low cell outputs a low level signal via an ON resistance of the NMOS transistor, so as to be connected to the terminal of the logic circuit.

Figure 18A:
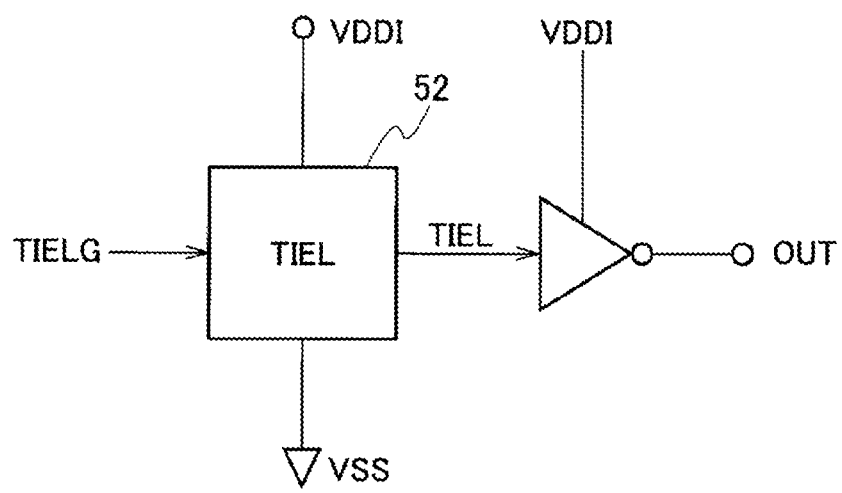
FIG. 18A is a diagram illustrating an inverter and a TIE-low cell in a semiconductor integrated circuit.
Figure 18B:
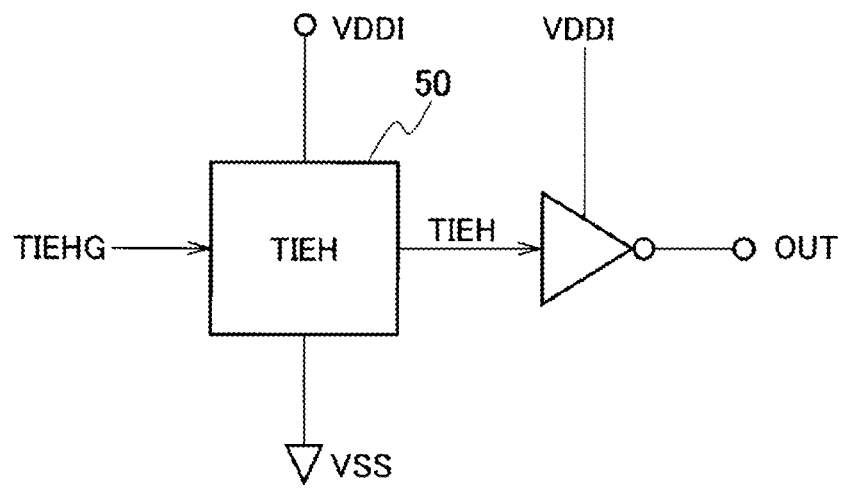
FIG. 18B is a diagram illustrating an inverter and a TIE-high cell in a semiconductor integrated circuit.

FIG. 18A is a diagram illustrating the inverter and the TIE-low cell 52, and FIG. 18B is a diagram illustrating the inverter and the TIE-high cell 50 in the semiconductor integrated circuit 100. In FIG. 18A, the second power voltage VDDI is applied to the inverter and the TIE-low cell 52. The TIE-low cell 52 outputs TIEL according to the gate input TIELG. In FIG. 18B, the second power voltage VDDI is applied to the inverter and the TIE-high cell 50. The TIE-high cell 50 output TIEH according to the gate input TIEHG.

As illustrated in FIG. 18A, the TIE-low cell 52 is connected to the inverter so that the input to the inverter may be fixed to the low level. Further, as illustrated in FIG. 18B, the TIE-high cell 50 is connected to the inverter so that the input to the inverter may be fixed to the high level.

Figure 19:
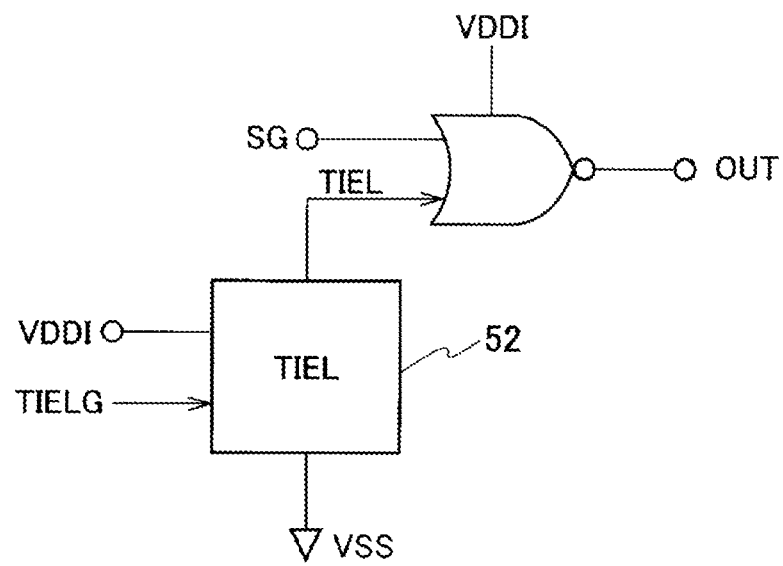
FIG. 19 is a diagram illustrating a two-input NOR gate and a TIE-low cell in a semiconductor integrated circuit.

FIG. 19 is a diagram illustrating a two-input NOR gate and the TIE-low cell 52 in the semiconductor integrated circuit 100. As illustrated in FIG. 19, the second power voltage VDDI is applied to the two-input NOR gate and the TIE-low cell 52. One of the two inputs is a signal input SG, and the other is connected to the TIE-low cell 52 and serves as a low level fixed input. The TIE-low cell 52 outputs TIEL according to the gate input TIELG. A two-input NOR gate output OUT is output according to the signal input SG and the low level fixed input TIEL.

Figure 20:
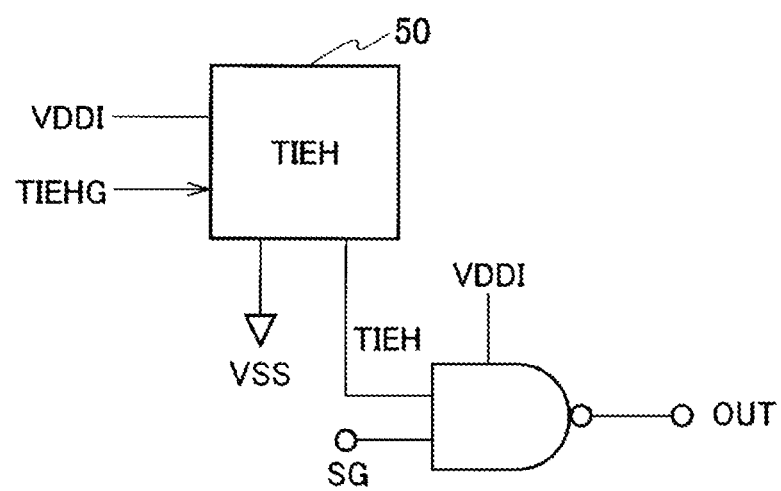
FIG. 20 is a diagram illustrating a two-input NAND gate and a TIE-high cell.

Further, FIG. 20 is a diagram illustrating a two-input NAND gate and the TIE-high cell 50 in the semiconductor integrated circuit 100. As illustrated in FIG. 20, the second power voltage VDDI is applied to the two-input NAND gate and the TIE-high cell 50. One of the two inputs is a signal input SG, and the other is connected to the TIE-high cell 50 and serves as a high level fixed input. The TIE-high cell 50 outputs TIEH according to the gate input of TIEHG. A two-input NAND gate output OUT is output according to the signal input SG and the high level fixed input TIEH.

Further, a flip/flop circuit, a decoder circuit, an encoder circuit, a multiplexer circuit, or the like may be used in addition to or instead of the TIE cell.

Further, while specific connection examples using the TIE-low cell and the TIE-high cell are described, the TIEL signal or the TIEH signal used in the second and third embodiments may be used instead.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising:
   a first power line to which a first voltage is applied;
   a second power line;
   a first power switch cell connected to the first power line and configured to output a second voltage to the second power line according to a first signal;
   a first logic circuit driven by the second voltage applied via the second power line;
   a first circuit driven by the second voltage applied via the second power line and configured to output a third voltage to first logic circuit according to a second signal which is an inverted signal of the first signal; and a second circuit driven by the second voltage applied via the second power line and configured to output a fourth voltage to first logic circuit according to a third signal which is an inverted signal of the second signal, the fourth voltage being lower than the third voltage.

2. The semiconductor integrated circuit according to claim 1, wherein the first circuit includes:
   an N-type metal-oxide semiconductor field-effect transistor (NMOSFET) having a source terminal connected to a third power line, and a gate terminal and a drain terminal which are short-circuited with each other; and
   a P-type metal-oxide semiconductor field-effect transistor (PMOSFET) having:
      a source terminal connected to the second power line,
      a gate terminal connected to the gate terminal of the NMOSFET and to which the second signal is input, and
      a drain terminal from which the third voltage is output.

3. The semiconductor integrated circuit according to claim 2, further comprising:
   a first branch line to which the second signal is supplied, wherein the first branch line is connected to the gate terminal of each of the NMOSFET and the PMOSFET.

4. The semiconductor integrated circuit according to claim 1, wherein the second circuit includes:
   a P-type metal-oxide semiconductor field-effect transistor (PMOSFET) having a source terminal connected to the second power line, and a gate terminal and a drain terminal which are short-circuited with each other; and
   an N-type metal-oxide semiconductor field-effect transistor (NMOSFET) having:
      a source terminal connected to a third power line,
      a gate terminal connected to the gate terminal of the PMOSFET and to which the third signal is supplied, and
      a drain terminal from which the fourth voltage is output.

5. The semiconductor integrated circuit according to claim 4, further comprising:
   a second branch line to which the third signal is supplied, wherein the second branch line is connected to the gate terminal of each of the NMOSFET and the PMOSFET.

6. The semiconductor integrated circuit according to claim 1, wherein the first power switch cell includes:
   a first inverter gate configured to invert the first signal to output the second signal;
   a second inverter gate connected to invert the second signal to output the third signal; and
   a switch disposed between the first and second power lines and configured to output the second voltage to the second power line according to the second signal.

7. The semiconductor integrated circuit according to claim 6, wherein the switch includes a P-type metal-oxide semiconductor field-effect transistor (PMOSFET).

8. The semiconductor integrated circuit according to claim 1, wherein a threshold voltage of a transistor of the first power switch cell is higher than a threshold voltage of a transistor of any of the first logic circuit, the first circuit, and the second circuit.

9. The semiconductor integrated circuit according to claim 1, further comprising:
   a first region to which the first voltage is continuously applied via the first power line; and
   a second region to which the second voltage is applied via the second power line, wherein
   the first and second circuits are included in the second region.

10. The semiconductor integrated circuit according to claim 9, wherein the first power switch cell is included in the second region.

11. The semiconductor integrated circuit according to claim 1, further comprising:
    a second logic circuit driven by the second voltage;
    a third circuit driven by the second voltage and configured to output the third voltage to the second logic circuit according to the second signal; and
    a fourth circuit driven by the second voltage and configured to output the fourth voltage to the second logic circuit according to the third signal.

12. The semiconductor integrated circuit according to claim 11, further comprising:
    a first region to which the first voltage is continuously applied via the first power line;
    a second region to which the second voltage is applied via the second power line; and
    a second power switch cell connected to the first power line and configured to output the second voltage to the second power line, wherein
    at least one of the first and second power switch cells is included in the second region.

13. A semiconductor integrated circuit, comprising:
    a first power line;
    a second power line;
    a first signal line;
    a first inverter connected to the first power line and having input and output electrodes, the input electrode connected to the first signal line;
    a first switch having gate, source, and drain electrodes, wherein
       the gate electrode is connected to the output electrode of the first inverter,
       one of the source and drain electrodes is connected to the first power line, and
       the other of the source and drain electrodes is connected to the second power line;
    a second inverter having input and output electrodes, the input electrode thereof connected to the output electrode of the first inverter; and
    a first circuit connected to the second power line and having first and second input electrodes, wherein the first input electrode is connected to the output electrode of the first inverter, and the second input electrode is connected to the output electrode of the second inverter.

14. The semiconductor integrated circuit according to claim 13, wherein
    the first inverter is configured to invert a first signal that is input through the first signal line to generate a second signal,
    the second inverter is configured to invert the second signal to generate a third signal, and
    a voltage level of the second signal is less than the third signal.

15. The semiconductor integrated circuit according to claim 14, further comprising:
    a first buffer gate between the output electrode of the first inverter and the first input electrode of the first circuit, and
    a second buffer gate between the output electrode of the second inverter and the second input electrode of the first circuit.

16. The semiconductor integrated circuit according to claim 14, wherein
   a first voltage is continuously applied to the first power line, and
   the first switch is configured to output a second voltage to the second power line according to the second signal.

17. The semiconductor integrated circuit according to claim 13, wherein the first switch is a transistor having a threshold voltage higher than a threshold voltage of a transistor of the first circuit.

18. The semiconductor integrated circuit according to claim 13, further comprising:
   a second circuit driven by the second voltage.

19. The semiconductor integrated circuit according to claim 18, further comprising:
   a first region to which a first voltage is continuously applied via the first power line;
   a second region to which a second voltage is applied via the second power line; and
   a second switch connected to the first power line and configured to apply the second voltage to the second power line, wherein
   at least one of the first and second switches is included in the second region.

* * * * *